US011929605B2

United States Patent
Kojima

(10) Patent No.: US 11,929,605 B2
(45) Date of Patent: Mar. 12, 2024

(54) SEMICONDUCTOR DEVICE

(71) Applicant: Mitsubishi Electric Corporation, Tokyo (JP)

(72) Inventor: Tomokazu Kojima, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 214 days.

(21) Appl. No.: 17/637,148

(22) PCT Filed: Nov. 4, 2020

(86) PCT No.: PCT/JP2020/041206
§ 371 (c)(1),
(2) Date: Feb. 22, 2022

(87) PCT Pub. No.: WO2021/095602
PCT Pub. Date: May 20, 2021

(65) Prior Publication Data
US 2022/0311233 A1    Sep. 29, 2022

(30) Foreign Application Priority Data
Nov. 14, 2019    (WO) ............... PCT/JP2019/044667

(51) Int. Cl.
H02H 3/02 (2006.01)
H01L 29/66 (2006.01)
H02H 1/00 (2006.01)

(52) U.S. Cl.
CPC ......... H02H 3/021 (2013.01); H01L 29/6609 (2013.01); H02H 1/0007 (2013.01)

(58) Field of Classification Search
CPC ............. G01R 19/16552; G01R 31/54; H01L 29/6609; H02H 1/0007; H02H 3/021; H03K 2217/0018
(Continued)

(56) References Cited

U.S. PATENT DOCUMENTS 5,942,677 A     8/1999  Vulih et al.
8,937,797 B2 *  1/2015  Pirchio ................. G01R 31/52
                                                    330/264
(Continued)

FOREIGN PATENT DOCUMENTS

WO    WO-2017169057 A1 * 10/2017 ............. G01R 31/02

OTHER PUBLICATIONS

Machine translation of Komatsu et al. International Patent Document WO 2017169057 A1 Oct. 2017 (Year: 2017).*
(Continued)

*Primary Examiner* — Kevin J Comber
(74) *Attorney, Agent, or Firm* — BUCHANAN INGERSOLL & ROONEY PC

(57) ABSTRACT

First and second output transistors are connected in series between a power supply terminal and a ground terminal through an output node connected to an output terminal. An output transistor control circuit is arranged corresponding to at least one of the first and second output transistors and is configured to input a voltage at the output terminal to the gate of the first output transistor at a time of occurrence of disconnection of the power supply terminal and input the same to the gate of the second output transistor at a time of occurrence of disconnection of the ground terminal. The first output transistor has a conductivity type to turn off when a power supply voltage is input to the gate, and the second output transistor has a conductivity type to turn off when a ground voltage is input to the gate.

20 Claims, 18 Drawing Sheets

(58) Field of Classification Search
USPC .......................................................... 361/93.1
See application file for complete search history.

(56) References Cited

U.S. PATENT DOCUMENTS

2020/0083878 A1* 3/2020 Namai ............. H03K 19/09421
2022/0216867 A1* 7/2022 Nakagawa ............. G01R 31/54

OTHER PUBLICATIONS

International Search Report (PCT/ISA/210) with English translation and Written Opinion (PCT/ISA/237) dated Dec. 22, 2020, by the Japan Patent Office as the International Searching Authority for International Application No. PCT/JP2020/041206.
Paul et al., "Analysis and Design of Analog Integrated Circuits Fourth Edition", John Wiley & Sons, Inc., 2001, pp. 309-312.

* cited by examiner

FIG. 17

SEMICONDUCTOR DEVICE

TECHNICAL FIELD

The present disclosure relates to a semiconductor device.

BACKGROUND ART

In semiconductor devices such as large-scale integrated circuits (LSIs) and integrated circuits (ICs) mounted on industrial devices, there has been a demand for enhancement of fail-safe functions in case of disconnection.

For example, U.S. Pat. No. 5,942,677 (PTL 1) describes a configuration for a fail-safe in case of disconnection in a knock sensor system in which an output signal from a knock sensor is processed by an IC and input to a microprocessor on the following stage. Specifically, there is a description of a configuration of a detection circuit for detecting disconnection of an output signal line of the IC from the knock sensor, and when the disconnection is detected, an output voltage from the IC to the microprocessor is forcedly set to a voltage (0 [V]) outside of a voltage range (0.5 to 5 [V]) in a normal state (at a time of non-occurrence of disconnection).

In PTL 1, when the output signal line of the knock sensor is disconnected, the IC on the following stage is reliably notified of occurrence of disconnection.

CITATION LIST

Patent Literature

PTL 1: U.S. Pat. No. 5,942,677

SUMMARY OF INVENTION

Technical Problem

However, in a semiconductor device, a power supply line and a ground line may also be disconnected in addition to disconnection of a signal line described in PTL 1. The detection circuit in PTL 1 fails to detect such power supply lines and ground lines and moreover does not consider a fail-safe function for such disconnection.

On the other hand, as a common configuration of a semiconductor device, an output terminal for electrical contact with outside of the semiconductor device is sometimes connected to a power supply line and a ground line through a transistor on an output stage for driving a voltage at the output terminal. The back gate terminal (body) of the transistor forming the output stage is usually connected to the power supply line or the ground line.

The output terminal may be pulled up or pulled down on the outside of the semiconductor device. Thus, when one of the power supply line and the ground line is disconnected in the inside of the semiconductor device, abnormal current may be produced between the other line having no disconnection and the pull-up or the pull-down outside the semiconductor device, due to a current path formed by turning-on of the body diode of the transistor on the output stage.

The present disclosure is made in order to solve such a problem and an object of the present disclosure is to prevent occurrence of abnormal current at a time of occurrence of disconnection of a power supply line or a ground line.

Solution to Problem

According to an aspect of the present disclosure, a semiconductor device includes first and second power supply terminals, an output terminal, first and second output transistors, an output terminal capable of electrical contact from outside of the semiconductor device, a disconnection detection circuit, and an output transistor control circuit. The first power supply terminal receives a first power supply voltage. The second power supply terminal receives a second power supply voltage lower than the first power supply voltage. The first output transistor is connected between the first power supply terminal and an output node and allows current in accordance with a first control voltage to flow from the first power supply terminal to the output node. The first output transistor has a conductivity type to turn off when the first power supply voltage is input to a gate. The second output transistor is connected between the output node and the second power supply terminal and allows current in accordance with a second control voltage to flow from the output node to the second power supply terminal. The second output transistor has a conductivity type to turn off when the second power supply voltage is input to a gate. The output terminal is electrically connected to the output node. The disconnection detection circuit detects at least one of first disconnection in an input path of the first power supply voltage to the first power supply terminal and second disconnection in an input path of the second power supply voltage to the second power supply terminal. The output transistor control circuit is arranged corresponding to at least one of the first and second output transistors. The output transistor control circuit arranged corresponding to the first output transistor inputs a voltage at the output terminal to the gate of the first output transistor at a time of occurrence of the first disconnection. The output transistor control circuit arranged corresponding to the second output transistor inputs a voltage at the output terminal to the gate of the second output transistor at a time of occurrence of the second disconnection. Of the first and second output transistors, the output transistor for which the output transistor control circuit is arranged includes two transistors of a same conductivity type connected in series. The two transistors have back gate terminals connected in common to a connection node of the two transistors.

According to another aspect of the present disclosure, a semiconductor device includes first and second power supply terminals, an output terminal, first and second output transistors, an output terminal capable of electrical contact from outside of the semiconductor device, a switch circuit, and a disconnection detection circuit. The first power supply terminal receives a first power supply voltage. The second power supply terminal receives a second power supply voltage lower than the first power supply voltage. The first output transistor is connected between the first power supply terminal and an output node and allows current in accordance with a first control voltage to flow from the first power supply terminal to the output node. The second output transistor is connected between the output node and the second power supply terminal and allows current in accordance with a second control voltage to flow from the output node to the second power supply terminal. The output terminal is electrically connected to the output node. The switch circuit includes at least one of a first switch transistor of a first conductivity type and a second switch transistor of a second conductivity type. The first switch transistor is inserted and connected in a first path from the first power supply terminal to the output terminal via a body diode of the first output transistor and the output node. The second switch transistor is inserted and connected in a second path from the second power supply terminal to the output terminal via a body diode of the second output transistor and the output node. The disconnection detection circuit generates at least one of a first reference voltage to control ON and OFF of the first switch transistor and a second reference voltage to control ON and OFF of the second switch transistor. In the disconnection detection circuit, the first reference voltage is generated to turn on the first switch transistor at a time of non-occurrence of first disconnection in an input path of the first power supply voltage to the first power supply terminal and to turn off the first switch transistor at a time of occurrence of the first disconnection. The second reference voltage is generated to turn on the second switch transistor at a time of non-occurrence of second disconnection in an input path of the second power supply voltage to the second power supply terminal and to turn off the second switch transistor at a time of occurrence of the second disconnection.

Advantageous Effects of Invention

According to the present disclosure, when the first disconnection on the first power supply voltage side or the second disconnection on the second power supply voltage side occurs in a state in which a pull-up resistor or a pull-down resistor is connected to the output terminal on the outside of the semiconductor device, cutting off a current path by turning-off of the first or second switch transistor or cutting off a current path of the first or second output transistor by the output transistor control circuit can prevent occurrence of abnormal current between the pull-up resistor and the disconnected first power supply terminal or between the pull-down resistor and the disconnected second power supply terminal.

BRIEF DESCRIPTION OF DRAWINGS

FIG. 17 is a circuit diagram illustrating a first configuration example of a semiconductor device according to a modification to the fourth embodiment.

DESCRIPTION OF EMBODIMENTS

Figure 1:
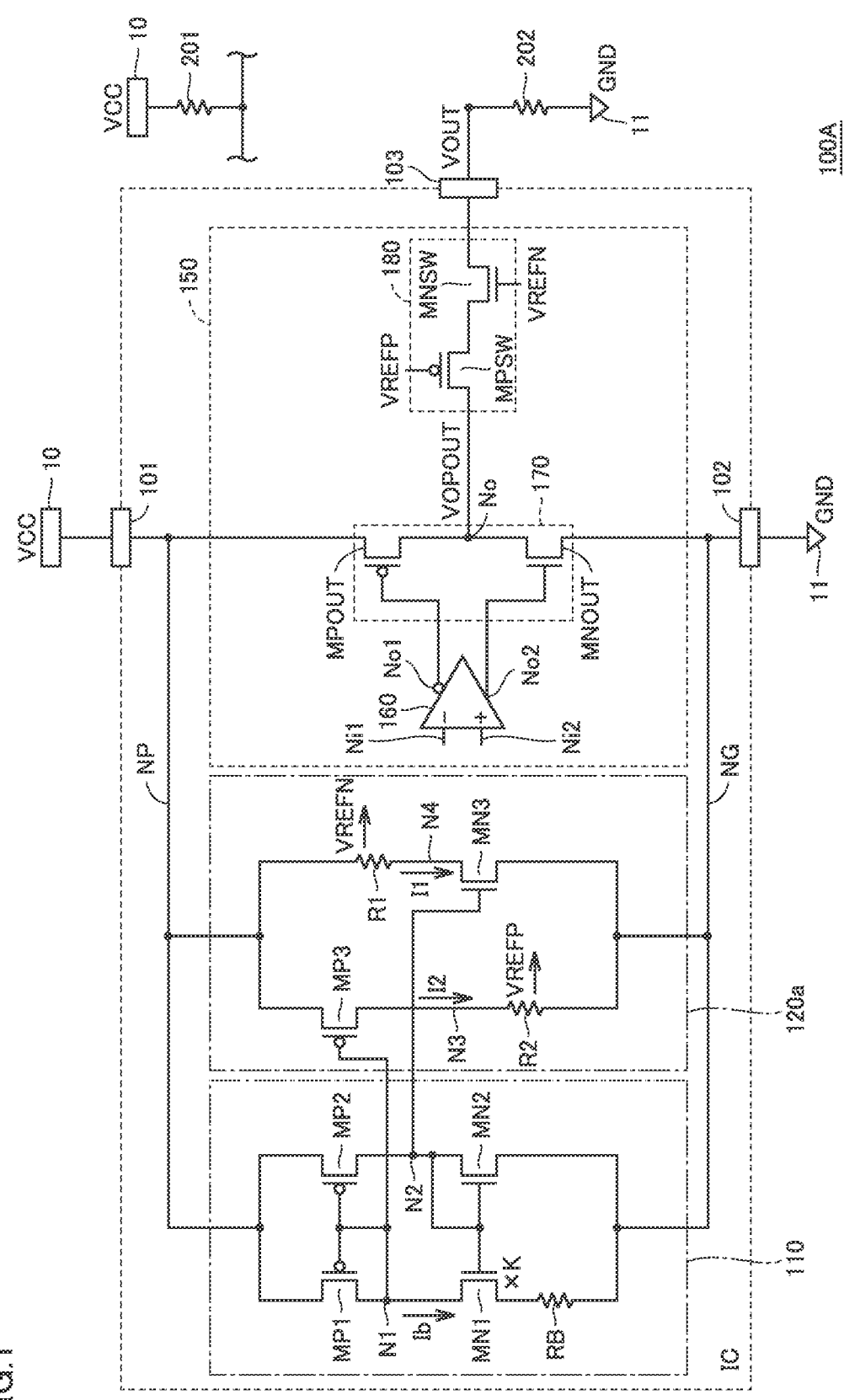
FIG. 1 is a circuit diagram illustrating a configuration example of a semiconductor device according to a first embodiment.

Embodiments of the present disclosure will be described in detail below with reference to the drawings. In the following, like or corresponding parts in the drawings are denoted by like reference signs and a description thereof is basically not repeated.

First Embodiment (Circuit Configuration)

FIG. 1 is a circuit diagram illustrating a configuration example of a semiconductor device according to a first embodiment.

Referring to FIG. 1, a semiconductor device 100A according to the first embodiment includes a power supply terminal 101, a ground terminal 102, an output terminal 103, a power supply node NP, a GND node NG, a bias circuit 110, a disconnection detection circuit 120a, and an operational amplifier 150. Operational amplifier 150 includes a differential amplifier 160, an output stage 170, and a switch circuit 180.

Power supply terminal 101 is electrically connected to a power supply 10 for supplying a power supply voltage VCC (for example, 5 [V]) through a power supply line. Ground terminal 102 is electrically connected to a reference voltage node 11 for supplying a ground voltage GND (0 [V]). Power supply node NP is connected to power supply terminal 101 and is a generic term for lines that supply power supply voltage VCC in semiconductor device 100A. Similarly, GND node NO is connected to ground terminal 102 and is a generic term for lines that supply ground voltage GND in semiconductor device 100A.

In the present embodiment, it is assumed that a pull-up resistor 201 or a pull-down resistor 202 is connected to output terminal 103 on the outside of semiconductor device 100A. When pull-up resistor 201 is connected, output terminal 103 is electrically connected to power supply 10 through pull-up resistor 201, on the outside of semiconductor device 100A. Similarly, when pull-down resistor 202 is connected, output terminal 103 is electrically connected to reference voltage node 11 through pull-down resistor 202, on the outside of semiconductor device 100A.

Bias circuit 110 includes P-type transistors MP1 and MP2, N-type transistors MN1 and MN2, and a resistor element RB. Transistors MP1 and MP2 are connected between power supply node NP and nodes N1 and N2, respectively. The gates of transistors MP1 and MP2 are connected in common to node N1. Transistors MN1 and resistor element RB are connected in series between node N1 and GND node NG. A transistor MN3 is connected between node N2 and GND node NG.

Disconnection detection circuit 120a includes a series circuit of a resistor R1 and transistor MN3 and a series circuit of a resistor R2 and a transistor MP3. Transistor MP3 is connected between power supply node NP and a node N3. Resistor R2 is connected between node N3 and GND node NG. The gate of transistor MP3 is connected to node N1 of bias circuit 110.

Resistor R1 is connected between power supply node NP and a node N4. Transistor MN3 is connected between node N4 and GND node NG. The gate of transistor MN3 is connected to node N2 of bias circuit 110. Disconnection detection circuit 120a generates reference voltages VREFP and VREFN by resistors R1 and R2.

Differential amplifier 160 has an inversion input node Ni1 and a non-inversion input node Ni2, and an inversion output node No1 and a non-inversion output node No2. A voltage difference produced between inversion output node No1 and non-inversion output node No2 is the one obtained by amplifying a voltage difference between inversion input node Ni1 and non-inversion input node Ni2. For example, analog voltages of opposite phases are input to inversion input node Ni1 and non-inversion input node Ni2.

Output stage 170 includes a P-type transistor (output transistor) MPOUT and an N-type transistor (output transistor) MNOUT. Output transistor MPOUT is connected between power supply node NP and output node No. Output transistor MNOUT is connected between output node No and GND node NG. The gate of output transistor MPOUT is connected to inversion output node No1 (−side) of differential amplifier 160, and the gate of output transistor MNOUT is connected to non-inversion output node No2 (+side) of differential amplifier 160.

The voltage at inversion output node No1 (−side), that is, an input voltage from differential amplifier 160 to the gate of output transistor MPOUT corresponds to an embodiment of "first control voltage". Similarly, the voltage at non-inversion output node No2 (+side), that is, an input voltage from differential amplifier 160 to the gate of output transistor MNOUT corresponds to an embodiment of "second control voltage". Output transistors MPOUT and MNOUT are driven in accordance with an output (the first and second control voltages) of differential amplifier 160, so that an output voltage VOPOUT of operational amplifier 150 is generated at output node No.

Switch circuit 180 includes a P-type transistor (switch transistor) MPSW and an N-type transistor (switch transistor) MNSW connected in series between output node No and output terminal 103.

A reference voltage VREFP generated by disconnection detection circuit 120a is input to the gate of switch transistor MPSW. A reference voltage VREFN generated by disconnection detection circuit 120a is input to the gate of switch transistor MNSW.

Semiconductor device 100A operates an operational amplifier system that outputs output voltage VOPOUT (output node No) of operational amplifier 150 as output voltage VOUT from output terminal 103 to the outside of semiconductor device 100A, in accordance with an input signal to operational amplifier 150, specifically, a voltage difference between input signals to inversion input node Ni1 (−side) and non-inversion input node Ni2 (+side) of differential amplifier 160. When analog voltages of phases opposite to each other are input to inversion input node Ni1 and non-inversion input node Ni2 as described above, output voltage VOUT is obtained by amplifying the analog voltages (−side input) in a range of ground voltage GND to power supply voltage VCC.

Hereinafter, a state in which power supply voltage VCC and ground voltage GND are supplied normally to semiconductor device 100A is also referred to as "normal state". In the configuration in FIG. 1, power supply voltage VCC corresponds to an embodiment of "first power supply voltage", ground voltage GND corresponds to an embodiment of "second power supply voltage", power supply terminal 101 corresponds to an embodiment of "first power supply terminal", and ground terminal 102 corresponds to an embodiment of "second power supply terminal". Output transistor MPOUT on the power supply voltage side corresponds to "first output transistor", and output transistor MNOUT on the ground voltage side corresponds to "second output transistor".

(Operation in Normal State)

First of all, operation in a normal state of semiconductor device 100A will be described.

In bias circuit 110, transistor MP1 is diode-connected, and transistor MP2 forms a current mirror with transistor MP1. Similarly, transistor MN1 forms a current mirror with diode-connected transistor MN2. A proportional relation is therefore established between current Ib flowing through transistor MP1 and current flowing through transistor MP2.

When the transistor size of transistor MN1 is k times (k>0) as large as that of transistor MN2, current Ib is determined by an electrical resistance of resistor element. RB and k. Current Ib is used for the operation of any circuit block in semiconductor device 100A, for example, differential amplifier 160.

Bias circuit 110 is shown as an example of a circuit that is driven by power supply voltage VCC and ground voltage GND to generate a certain current Ib (called bias current), and its circuit configuration is not limited to the example in FIG. 1.

In disconnection detection circuit 120a, transistor MP3 having the gate connected to node N1 forms a current mirror with transistors MP1 and MP2 of bias circuit 110. Similarly, transistor MN3 having the gate connected to node N2 forms a current mirror with transistors MN1 and MN2 of bias circuit 110.

As a result, transistors MP3 and MN3 generate currents I1 and I2 proportional to current of transistors MP1 and MP2 and current of transistors MN1 and MN2 of bias circuit 110, respectively. That is, transistor MN3 generating current I1 correspond to "first transistor" and "current source (or first current source)". Similarly, transistor MP3 generating current I2 correspond to "second transistor" and "current source (or first current source)". Similarly, resistor R1 corresponds to an embodiment of "first resistor", and resistor R2 corresponds to an embodiment of "second resistor".

In disconnection detection circuit 120a, a "current source" is implemented in a simple configuration with transistors MP3 and MN3 forming current mirrors with the transistors in bias circuit 110. A voltage drop amount ΔV1 is produced in resistor R1 by current I1, and a voltage drop amount ΔV2 is produced in resistor R2 by current I2.

Figure 2:
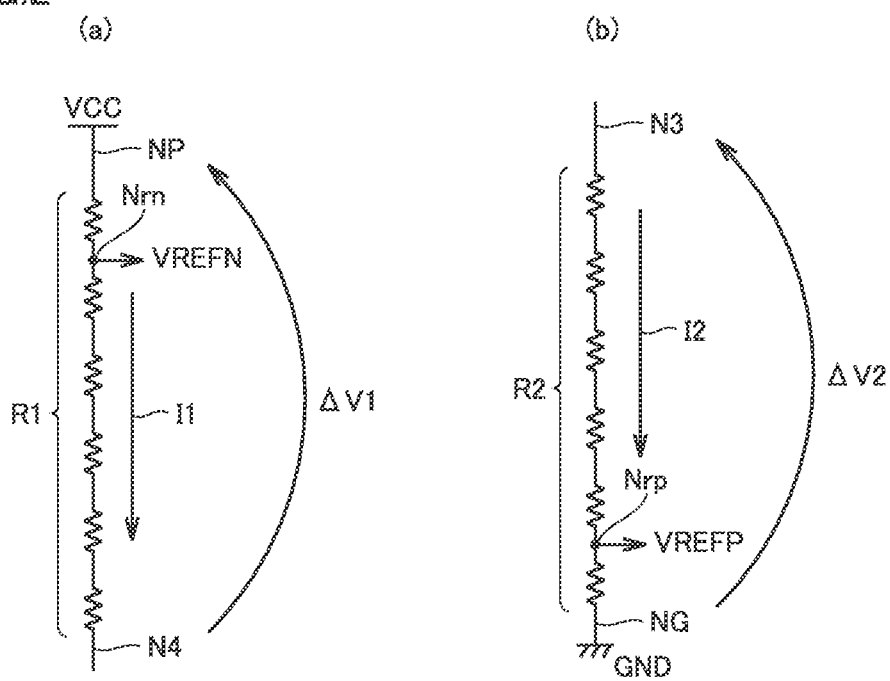
FIG. 2 is a circuit diagram illustrating a configuration example of resistors shown in FIG. 1.

FIG. 2 is a circuit diagram illustrating a configuration example of resistors R1 and R2 shown in FIG. 1.

Referring to FIG. 2(a), resistor R1 has a plurality of resistor elements connected in series between power supply node NP and node N4. Voltage drop amount ΔV1 in resistor R1 is divided by the resistor elements.

In resistor R1, a voltage at a high voltage-side node Nrn from power supply node NP to node N4 is taken out as reference voltage VREFN and input to the gate of switch transistor MNSW in FIG. 1. Reference voltage VREFN is set to a voltage higher than ground voltage GND, using a part or all of voltage drop amount ΔV1 by current I1.

Referring to FIG. 2(b), resistor R2 has a plurality of resistor elements connected in series between node N3 and GND node NG. Voltage drop amount ΔV2 in resistor R2 is divided by the resistor elements.

In resistor R2, a voltage at a low voltage-side node Nrp from node N3 to GND node NG is taken out as reference voltage VREFP and input to the gate of switch transistor MPSW in FIG. 1. Reference voltage VREFP is set to a voltage lower than power supply voltage VCC, using a part or all of voltage drop amount ΔV2 by current I2.

Reference voltage VREFN is set to a voltage that can turn on N-type switch transistor MNSW in a normal state in which a supply path of power supply voltage VCC and ground voltage GND is not disconnected. For example, node Nrn is set such that VREFN=4.8 [V] for VCC=5 [V]. Alternatively, node Nrn may be a node with the same potential as power supply node NP (VRFEN=5 [V]). Reference VREFN corresponds to an embodiment of "first reference voltage", and node Nrn corresponds to an embodiment of "first node".

Reference voltage VREFP is set to a voltage that can turn on P-type switch transistor MPSW in a normal state. For example, node Nrp is set such that VREFP=0.2 [V]. Alternatively, node Nrp may be a node with the same potential as GND node NG (VREFP=0 [V] in a normal state). Reference voltage VREFP corresponds to an embodiment of "second reference voltage", and node Nrp corresponds to an embodiment of "second node".

Referring to FIG. 1 again, an analog voltage such as an audio signal, an image signal, or an amplified signal of a sensor input (for example, a signal obtained by converting and amplifying an output of a Hall element) is input to inversion input node Ni1 (−side) and non-inversion input node Ni2 (+side) of differential amplifier 160. Alternatively, an analog voltage obtained by converting a digital signal by a D/A converter (not shown) arranged on the preceding stage of operational amplifier 150 may be input to differential amplifier 160.

Voltages having a voltage difference in accordance with input voltages to inversion input node Ni1 (−side) and non-inversion input node Ni2 (+side) are respectively produced at inversion output node No1 (−side) and non-inversion output node No2 (+side) of differential amplifier 160. Currents of output transistors MNOUT and MPOUT change in accordance with voltages at inversion input node Ni1 (−side) and non-inversion input node Ni2 (+side), so that output voltage VOPOUT in accordance with an input signal is produced at output node No.

In normal operation, reference voltages VREFP and VREFN are stably kept to voltages that can turn on switch transistors MPSW and MNSW (for example, 0.2 [V] and 4.8 [V]). In switch circuit 180, therefore, output voltage VOPOUT at output node No is transmitted to output terminal 103 by switch transistors MPSW and MNSW in the ON state.

Output voltage VOUT of semiconductor device 100A follows an output voltage of operational amplifier 150 and therefore is assumed to be an analog output rather than a digital output of GND (0 [V]) or VCC. As described above, a voltage in a range from approximately GND (0 [V])+20 [mV] to approximately VCC (for example, 5 [V])-20 [mv] based on an input signal (analog voltage, or a D/A converted voltage of a digital signal) is output from output terminal 103 in the form of a DX or AC voltage (sinusoidal wave or pulsed wave).

The operation of semiconductor device 100A when power supply voltage VCC or ground voltage GND is not supplied due to disconnection will now be described.

(Operation in Disconnection on Power Supply Voltage VCC Side)

Figure 3:
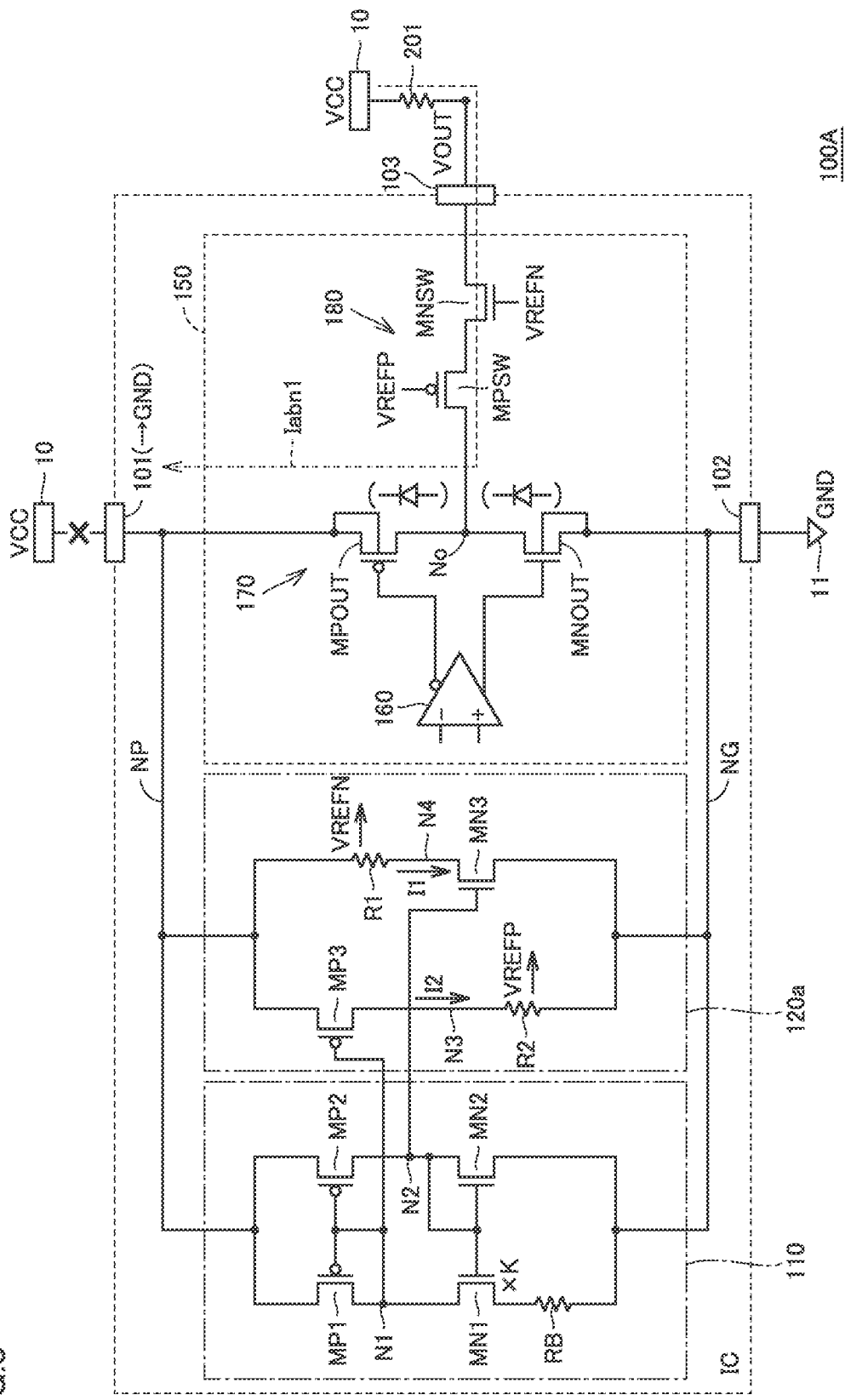
FIG. 3 is a circuit diagram at a time of disconnection on the power supply voltage side in the semiconductor device shown in FIG. 1.

FIG. 3 shows a circuit diagram at a time of disconnection on the power supply voltage side of semiconductor device 100A shown in FIG. 1.

Referring to FIG. 3, when disconnection occurs between power supply 10 and power supply terminal 101, power supply terminal 101 is opened and power supply node NP enters a high impedance (Hi-Z) state. As a result, semiconductor device 100A is provided only with ground voltage GND, and the voltage at power supply node NP decreases over time and ultimately converges to GND (0 [V]).

On the other hand, the bodies (back gate terminals) of output transistors MPOUT (P type) and MNOUT (N type) forming output stage 170 are usually connected to the source terminals. That is, in the configuration example of FIG. 1, the body of output transistor MPOUT is connected to power supply node NP, and the body of output transistor MNOUT is connected to GND node NG.

In the inside of output transistor MPOUT, therefore, a body diode is formed, in which the direction from the drain terminal (P−) to the body (N well) and the source terminals (that is, the direction from output node No to power supply node NP) is the forward direction. Similarly, also in the inside of output transistor MNOUT, a body diode is formed, in which the direction from the source terminal and the body (N well) to the drain terminal (P+) (that is, the direction from GND node NO to output node No) is the forward direction. In a normal state, since power supply node NP is fixed to power supply voltage VCC, and GND node NG is fixed to ground voltage GND, these body diodes are reverse-biased.

Here, supposing that switch circuit 180 is not disposed, disconnection on the power supply voltage VCC side may cause the voltage at power supply node NP to decrease and turn on the body diode of output transistor MPOUT. For example, when pull-up resistor 201 is connected to output terminal 103 on the outside of semiconductor device 100A, abnormal current Iabn1 shown by a dotted line in the figure may continuously occur through pull-up resistor 201, in a path of power supply 10 (VCC)—pull-up resistor 201—output terminal 103—output node No—the body diode of output transistor MPOUT—power supply node NP (decreased to GND).

When such current occurs, output voltage VOUT at output terminal 103 may become an unstable voltage that is not kept at power supply voltage VCC. Furthermore, current by the body diode induces latch up, leading to not only consumption of excessive current but also destruction of the chip.

The first embodiment addresses the problem at a time of disconnection by control of switch circuit 180 by disconnection detection circuit 120a.

Figure 4:
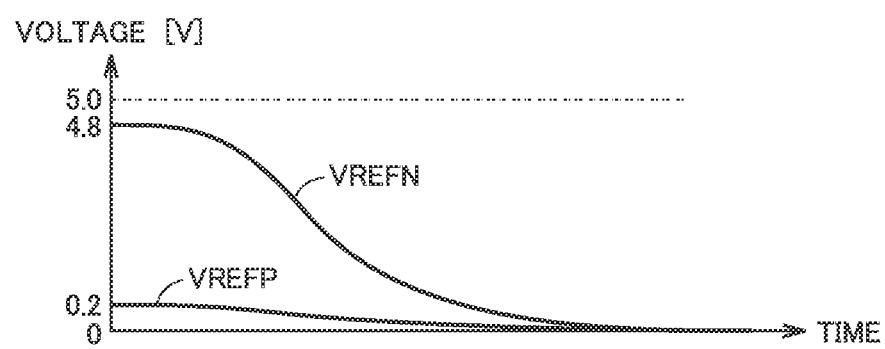
FIG. 4 is a waveform diagram of reference voltages from a disconnection detection circuit at a time of disconnection on the power supply voltage side.

FIG. 4 shows a waveform diagram of reference voltages from the disconnection detection circuit at a time of disconnection on the power supply voltage side.

Referring to FIG. 4, in a normal state, as explained with reference to FIG. 2, VREFN=4.8 [V] and VREFP[V]=0.2

[V] are stably kept. Thus, in switch circuit 180, switch transistors MPSW and MNSW are kept on.

When disconnection occurs on the power supply voltage VCC side, power supply node NP enters a high impedance (Hi-Z) state as described above, so that currents I1 and I2 no longer occur in disconnection detection circuit 120a as bias circuit 110 loses current driving force. Reference voltage VREFN, which is produced by voltage drop amount ΔV1 in resistor R1, decreases with disappearance of current I1 and finally VREFN becomes 0 [V] (GND). Similarly, reference voltage VREFP also decreases to 0[V] (GND) with disappearance of current I2.

In switch circuit 180, therefore, switch transistor MPSW is kept in the ON state, while switch transistor MNSW is fixed to the OFF state in accordance with decreasing reference voltage VREFN. Since switch transistor MNSW in the OFF state is on the order of a few hundred [MΩ] to a few [GΩ], the output of semiconductor device 100A can be brought to high impedance. In this situation, the body diode of output transistor MPOUT is unable to turn on and a path of abnormal current Iabn1 is not formed.

As a result, in the case where pull-up resistor 201 is connected to output terminal 103, even when disconnection occurs on the power supply voltage VCC side, occurrence of abnormal current (Iabn1 in FIG. 3) can be prevented. In this way, in the configuration example of FIG. 1, switch transistor MNSW turned off in accordance with change of reference voltage VREFN due to disconnection forms "first switch transistor".

(Operation in Disconnection on Ground Voltage GND Side)

Figure 5:
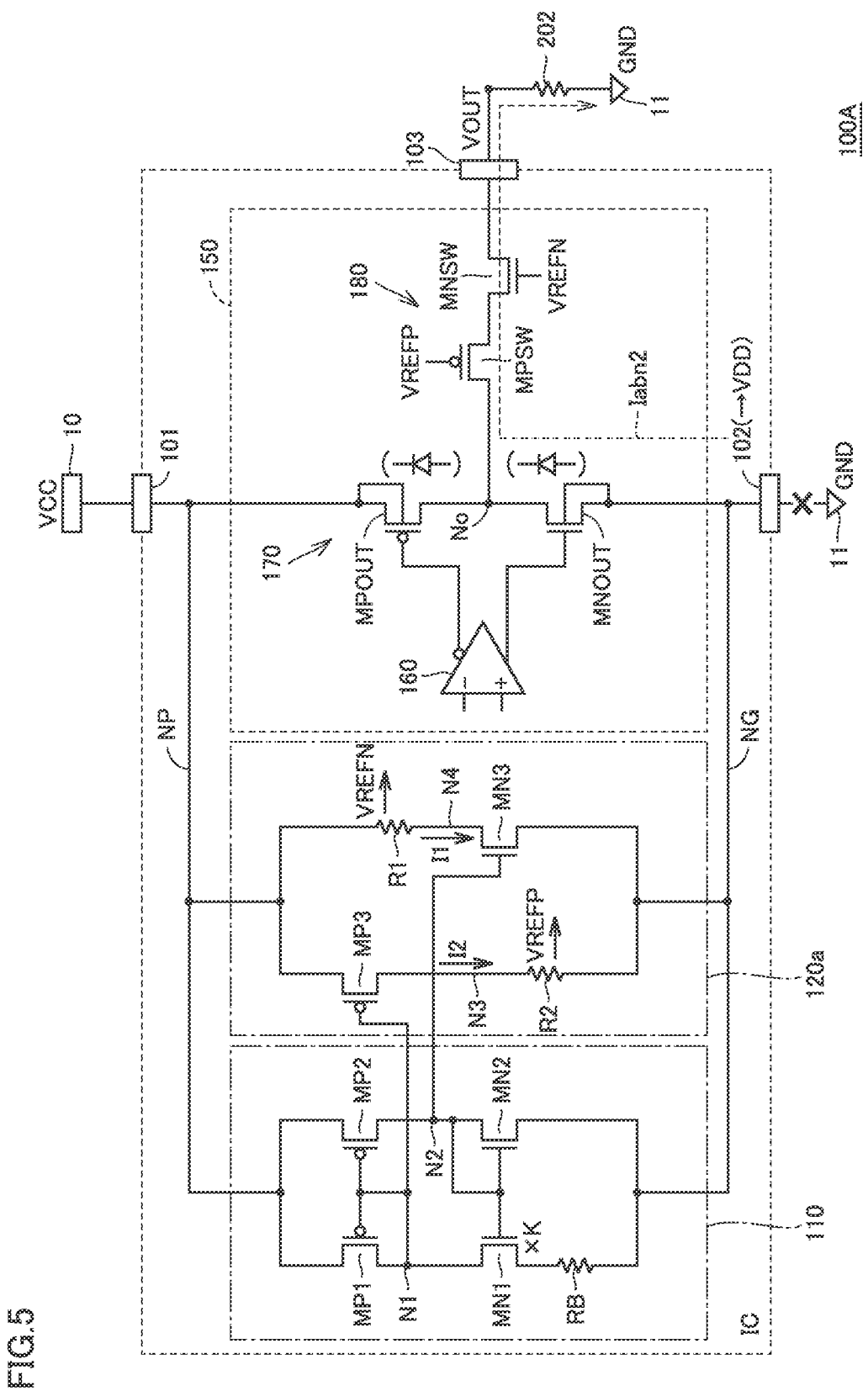
FIG. 5 is a circuit diagram at a time of disconnection on the ground voltage side in the semiconductor device shown in FIG. 1.

FIG. 5 shows a circuit diagram at a time of disconnection on the ground voltage side of semiconductor device 100A shown in FIG. 1.

Referring to FIG. 5, when disconnection occurs between reference voltage node 11 and ground terminal 102, ground terminal 102 is opened and GND node NG enters a high impedance (Hi-Z) state. As a result, semiconductor device 100A is provided only with power supply voltage VCC, and the voltage at GND node NG increases over time and ultimately converges to VCC (for example, 5 [V]).

Also in FIG. 5, supposing that switch circuit 180 is not disposed, disconnection on the ground voltage GND side may cause the voltage at GND node NG to increase and turn on the body diode of output transistor MNOUT described above. For example, when pull-down resistor 202 is connected to output terminal 103 on the outside of semiconductor device 100A, abnormal current Iabn2 shown by a dotted line in the figure may continuously occur through pull-down resistor 202, in a path of GND node NG (increased to VCC)—the body diode of output transistor MNOUT—output node No—pull-down resistor 202—reference voltage node 11 (GND).

Abnormal current Iabn2 at a time of disconnection on the ground voltage GND side also can be handled by control of switch circuit 180 by disconnection detection circuit 120a.

Figure 6:
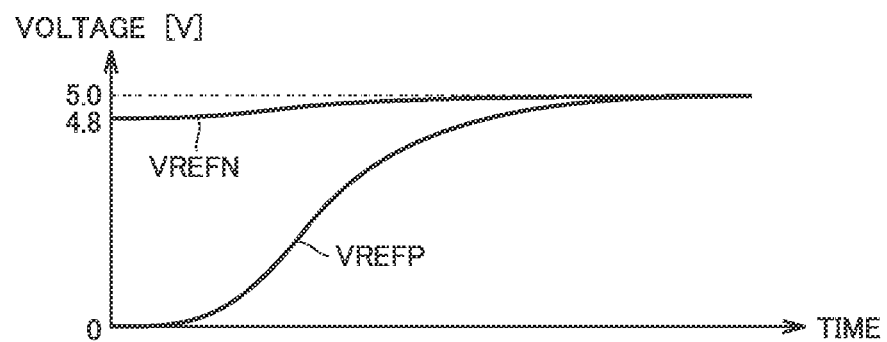
FIG. 6 is a waveform diagram of reference voltages from the disconnection detection circuit at a time of disconnection on the ground voltage side.

FIG. 6 shows a waveform diagram of reference voltages from the disconnection detection circuit at a time of disconnection on the ground voltage side.

Referring to FIG. 6, when disconnection occurs on the ground voltage GND side, GND node NG enters a high impedance (Hi-Z) state as described above, so that currents I1 and I2 no longer occur in disconnection detection circuit 120a as bias circuit 110 loses current driving force. Reference voltage VREFP, which is produced by voltage drop amount ΔV2 in resistor R2, increases with disappearance of current I2 and finally VREFN becomes VCC (for example, 5 [V]). Similarly, reference voltage VREFP also finally increases to VCC (5 [V]) with disappearance of current I1.

In switch circuit 180, therefore, switch transistor MNSW is kept in the ON state, while switch transistor MPSW is fixed to the OFF state in accordance with increasing reference voltage VREFP. Since switch transistor MPSW in the OFF state is also on the order of a few hundred [MΩ] to a few [GΩ], the output of semiconductor device 100A can be brought to high impedance. In this situation, the body diode of output transistor MNOUT is unable to turn on and a path of abnormal current Iabn2 is not formed.

As a result, in the case where pull-down resistor 202 is connected to output terminal 103, even when disconnection occurs on the ground voltage GND side, occurrence of abnormal current (Iabn2 in FIG. 5) can be prevented. In this way, in the configuration example of FIG. 1, switch transistor MPSW turned off in accordance with change of reference voltage VREFP due to disconnection forms "second switch transistor".

In this way, in semiconductor device 100A according to the first embodiment, the arrangement of switch circuit 180 can prevent occurrence of abnormal current through a path including the pull-up resistor or the pull-down resistor connected to output terminal 103 and the body diode of output transistor MPOUT or MNOUT when disconnection occurs on the power supply voltage side or the ground voltage side.

In the configuration example of FIG. 1, both of the P-type and the N-type switch transistors MPSW and MNSW are connected in series so that abnormal current at a time of occurrence of disconnection can be prevented when either of pull-up resistor 201 and pull-down resistor 202 is connected to output terminal 103 as explained with reference to FIG. 3 to FIG. 6.

However, when a circuit design premised on that only pull-up resistor 201 is connected to output terminal 103 (pull-down resistor 202 is not connected) is permitted, the arrangement of P-type switch transistor MPSW may be omitted, and switch circuit 180 may be formed only with N-type switch transistor MNSW. In this case, disconnection detection circuit 120a also may be configured only with the series circuit of resistor R1 and transistor MN3 for generating reference voltage VREFN.

Similarly, when a circuit design premised on that only pull-down resistor 202 is connected to output terminal 103 (pull-up resistor 201 is not connected) is permitted, the arrangement of N-type switch transistor MNSW may be omitted, and switch circuit 180 may be formed only with P-type switch transistor MPSW. In this case, disconnection detection circuit 120a also may be configured only with the series circuit of resistor R2 and transistor MP3 for generating reference voltage VREFP.

In this way, switch circuit 180 can be formed with at least one of the N-type switch transistor and the P-type switch transistor.

Further, in disconnection detection circuit 120a, reference voltages VREFP and VREFN are generated using a voltage drop by currents I1 and I2 produced by the current sources operating with supply of power supply voltage VCC and ground voltage GND, whereby disconnection can be detected promptly. That is, at a time of occurrence of disconnection, reference voltages VREFP and VREFN increase or decrease promptly in response to disappearance of currents I1 and I2, whereby switch transistor MPSW or MNSW can be turned off in a short time from the occurrence of disconnection.

Furthermore, each of switch transistors MPSW and MNSW can be formed with a parallel connection of a plurality of transistors having the gates controlled in common. By doing so, the output impedance of semiconductor device 100A in normal operation can be reduced.

Modifications to First Embodiment

In modifications to the first embodiment, modifications of the configuration of the disconnection detection circuit will be described.

Figure 7:
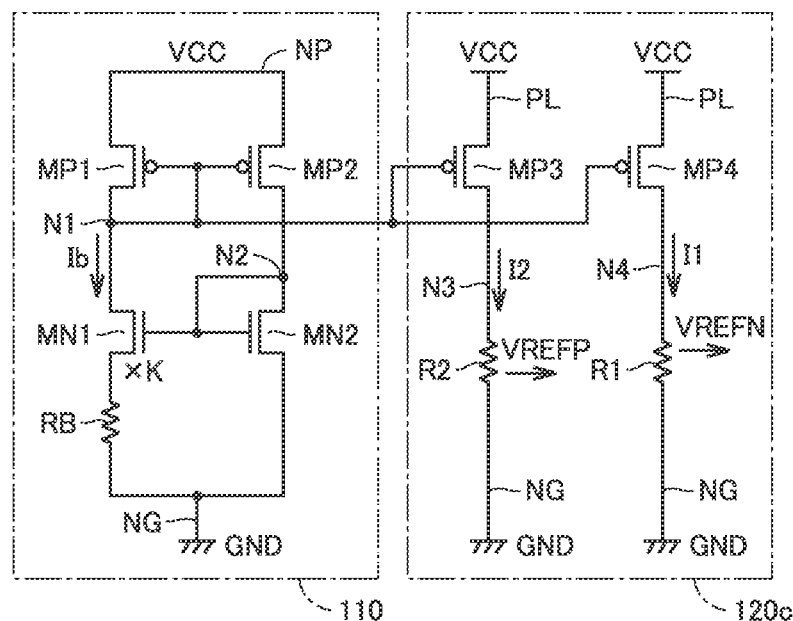
FIG. 7 is a circuit diagram illustrating a first modification of the disconnection detection circuit.

FIG. 7 is a circuit diagram illustrating a first modification of the disconnection detection circuit.

Referring to FIG. 7, a disconnection detection circuit 120c according to the first modification includes P-type transistors MP3 and MP4 and resistors R1 and R2.

In disconnection detection circuit 120c, transistor MP3 is connected between power supply node NP and node N3, and resistor R2 is connected between node N3 and GND node NG. Transistor MP4 is connected between power supply node NP and node N4, and resistor R1 is connected between node N4 and GND node NG. The gates of transistors MP3 and MP4 are connected in common to node N1 of bias circuit 110.

Each of transistors MP3 and MP4 forms a current mirror with transistors MP1 and MP2 of bias circuit 110 to generate current I1, I2. Resistor R1 produces reference voltage VREFN from high voltage-side node Nrn in the same manner as in FIG. 2(a), and resistor R2 produces reference voltage VREFP from low voltage-side node Nrp in the same manner as in FIG. 2(b).

Even in disconnection detection circuit 120c in FIG. 7, reference voltages VREFP and VREFN can be generated in the same manner as in the first embodiment.

In disconnection detection circuit 120c in FIG. 7, when the characteristics of transistors MP3 and MP4 and resistors R1 and R2 are designed equally, currents I1 and I2 are set equally, so that the sensitivity of detecting disconnection on the power supply voltage VCC side and the sensitivity of detecting disconnection on the ground voltage GND side (detection level and detection speed) can be easily matched.

Figure 8:
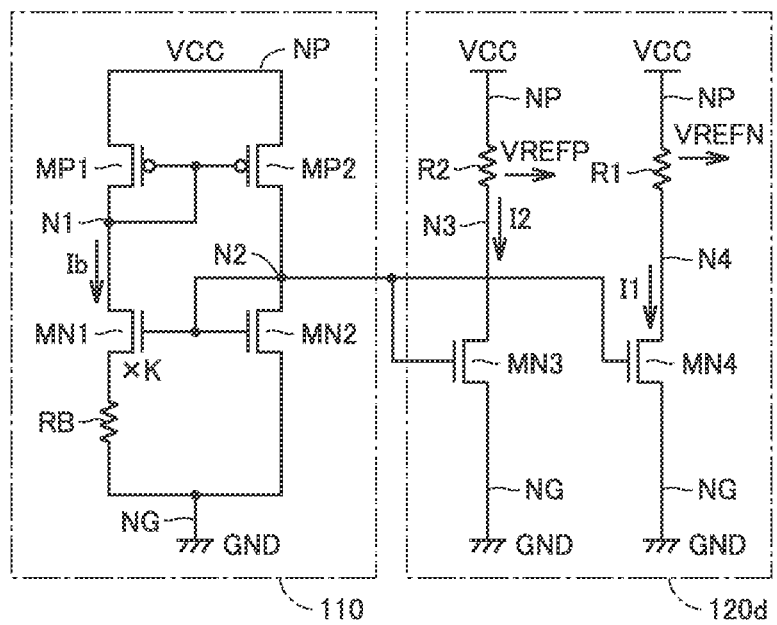
FIG. 8 is a circuit diagram illustrating a second modification of the disconnection detection circuit.

FIG. 8 shows a modification to the configuration example of FIG. 7.

Referring to FIG. 8, a disconnection detection circuit 120d according to a second modification includes N-type transistors MN3 and MN4 and resistors R1 and R2.

In disconnection detection circuit 120d, resistor R2 is connected between power supply node NP and node N3, and transistor MN3 is connected between node N3 and GND node NG. Resistor R1 is connected between power supply node NP and node N4, and transistor MN4 is connected between node N4 and GND node NG. The gates of transistors MN3 and MN4 are connected in common to node N2 of bias circuit 110.

Each of transistors MN3 and MN4 forms a current mirror with transistors MN1 and MN2 of bias circuit 110 to generate current I1, I2. Resistor R1 produces reference voltage VREFN from high voltage-side node Nrn in the same manner as in FIG. 2(a), and resistor R2 produces reference voltage VREFP from low voltage-side node Nrp in the same manner as in FIG. 2(b).

Even in disconnection detection circuit 120d in FIG. 8, reference voltages VREFP and VREFN can be generated in the same manner as in the first embodiment. Furthermore, in disconnection detection circuit 120d, the characteristics of transistors MN3 and MN4 and resistors R1 and R2 are designed equally, so that the sensitivity of detecting disconnection on the power supply voltage VCC side and the sensitivity of detecting disconnection on the ground voltage GND side (detection level and detection speed) can be easily matched, in the same manner as in disconnection detection circuit 120k.

Even with disconnection detection circuits 120c and 120d shown in FIG. 7 and FIG. 8, the behavior at a time of disconnection of reference voltages VREFP and VREFN is similar to that described with reference to FIG. 4 and FIG. 6. That is, in a normal state, since reference voltage VREFP is in the vicinity of ground voltage GND and reference voltage VREFN is in vicinity of power supply voltage VCC, switch transistors MPSW and MNSW turn on. On the other hand, when disconnection occurs on the power supply voltage VCC side, reference voltages VREFN and VREFP decrease to ground voltage GND, so that switch transistor MNSW can be turned off. When disconnection occurs on the ground voltage GND side, reference voltages VREFN and VREFP increase to power supply voltage VCC, so that switch transistor MPSW can be turned of.

That is, using disconnection detection circuits 120c and 120d described in the modifications to the first embodiment, abnormal current at a time of occurrence of disconnection can also be prevented by controlling switch circuit 180 in the same manner as in the first embodiment.

Second Embodiment

Figure 9:
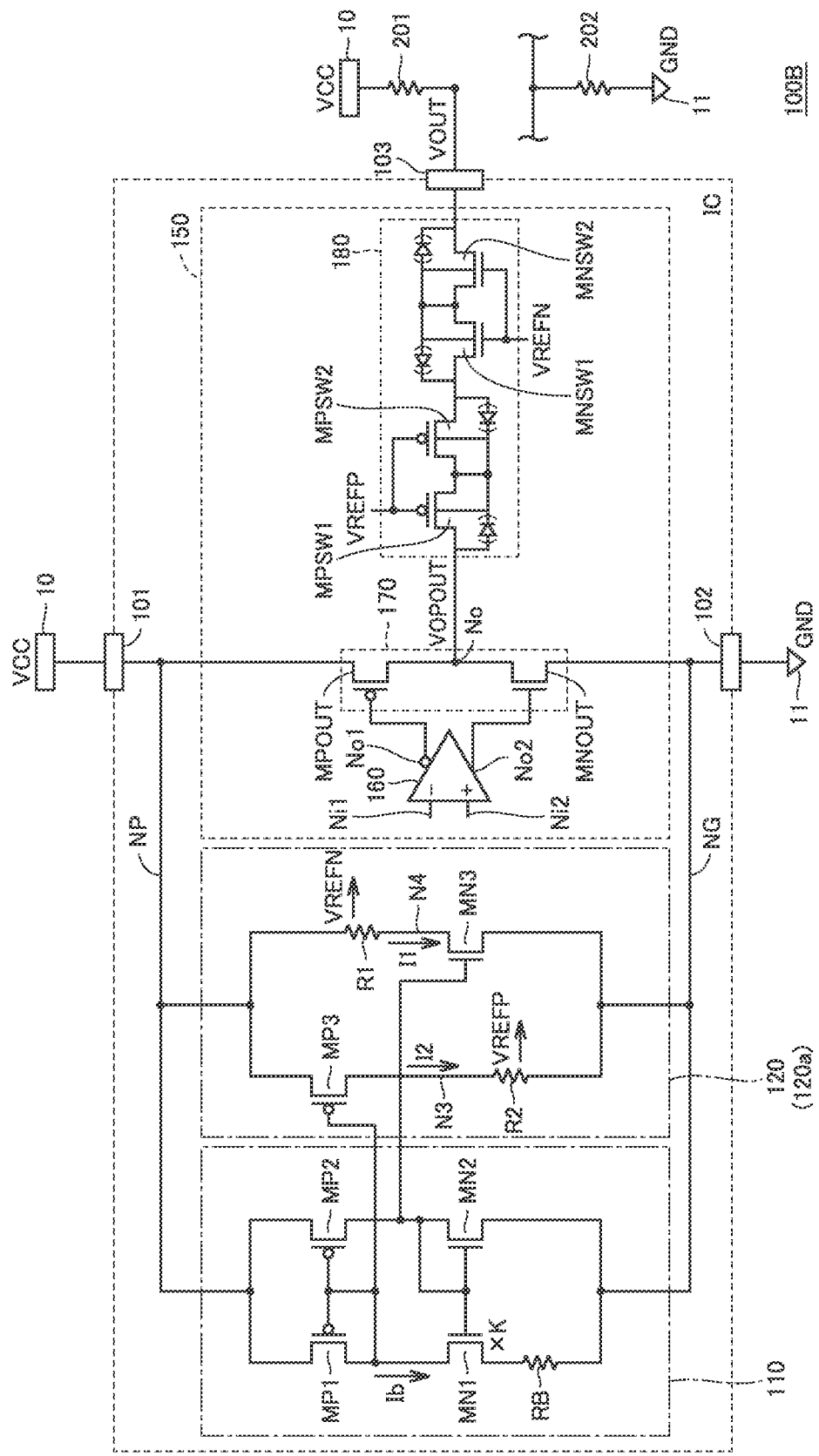
FIG. 9 is a circuit diagram illustrating a configuration example of a semiconductor device according to a second embodiment.

FIG. 9 is a circuit diagram illustrating a configuration example of a semiconductor device according to a second embodiment.

Referring to FIG. 9, a semiconductor device 100B according to the second embodiment differs from semiconductor device 100A according to the first embodiment in configuration of switch circuit 180. Except for switch circuit 180, the configuration of semiconductor device 100B is similar to that of semiconductor device 100A and a detailed description will not be repeated.

In semiconductor device 100B, switch circuit 180 includes P-type switch transistors MPSW1 and MPSW2 connected in series and N-type switch transistors MNSW1 and MNSW2 connected in series. The back gate terminals of switch transistors MPSW1 and MPSW2 are connected in common to a connection point (connection node) of switch transistors MPSW1 and MPSW2. Similarly, the back gate terminals of switch transistors MNSW1 and MNSW2 are connected in common to a connection point (connection node) of switch transistors MNSW1 and MNSW2. In the second embodiment, two switch transistors MNSW1 and MNSW2 form "first switch transistor", and two switch transistors MPSW1 and MPSW2 form "second switch transistor".

Reference voltage VREFP from disconnection detection circuit 120 (120a) is input in common to the gates of P-type switch transistors MPSW1 and MPSW2, in the same manner as switch transistor MPSW in the first embodiment. Similarly, reference voltage VREFN from disconnection detection circuit 120 (120a) is input in common to the gates of N-type switch transistors MNSW1 and MNSW2, in the same manner as switch transistor MNSW in the first embodiment.

That is, it is understood that, in the second embodiment, each of switch transistors MPSW and MNSW in the first embodiment is replaced by a plurality of N-type or P-type transistors arranged in such a manner that body diodes (parasitic diodes) of opposite polarities are connected in series in the OFF state, as denoted by parenthesized symbols in FIG. 9.

In semiconductor device 100A according to the first embodiment, at a time of occurrence of disconnection, switch transistor MNSW or MPSW is turned off to bring output terminal 103 into a high impedance state, thereby avoiding occurrence of abnormal current. However, when the back gate voltage of switch transistor MNSW or MPSW turned off is power supply voltage VCC or ground voltage GND, turning-on of the body diode (parasitic diode) of the switch transistor may cause leak current in switch circuit 180. To put it the other way, in the first embodiment, it is preferable that switch transistors MPSW and MNSW are formed with transistors with a back gate floating structure in order to ensure cut-off of abnormal current.

In comparison, in semiconductor device 100B according to the second embodiment, the N-type or P-type switch transistor that turns off at a time of occurrence of disconnection can be formed with a plurality of transistors arranged such that parasitic diodes of opposite polarities are connected in series in the OFT state. This more reliably prevents leak current via the back gate terminals (bodies) of a plurality of switch transistors turned off by reference voltage VREFP or VREFN from occurring between output node No and output terminal 103. That is, the effect of avoiding occurrence of abnormal current can be enhanced.

On the other hand, in the second embodiment, the output impedance in a normal state may be increased because the number of switch transistors connected in series between output node No and output terminal 103 increases.

Thus, it is preferable that reference voltages VREFP and VREFN in a normal state are respectively as close to ground voltage GND and power supply voltage VCC as possible. In FIG. 2(a), therefore, node Nrn for taking out reference voltage VREFN is preferably a node on the highest voltage side, that is, a node with the same potential as power supply node NP. Also in this case, at a time of occurrence of disconnection on the power supply voltage VCC side, reference voltage VREFN changes toward ground voltage GND due to disappearance of current I1, so that switch transistors MNSW1 and MNSW2 can be turned off.

Similarly, in FIG. 2(b), node Nrp for taking out reference voltage VREFP is preferably a node on the lowest voltage side, that is, a node with the same potential as GND node NG. Also in this case, at a time of occurrence of disconnection on the ground voltage GND side, reference voltage VREFP changes toward power supply voltage VCC due to disappearance of current I2, so that switch transistors MPSW1 and MPSW2 can be turned off.

Third Embodiment

Figure 10:
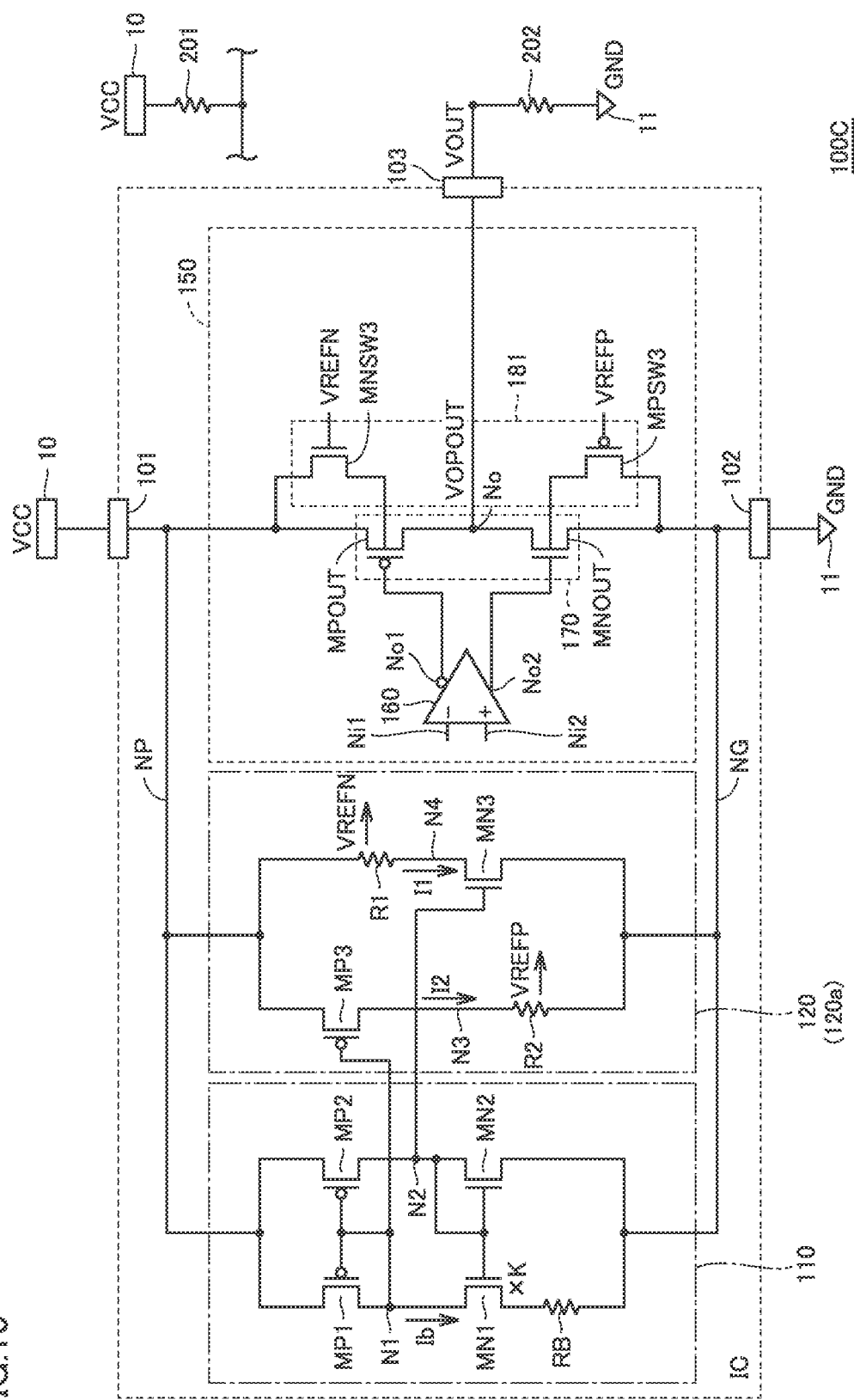
FIG. 10 is a circuit diagram illustrating a configuration example of a semiconductor device according to a third embodiment.

FIG. 10 is a circuit diagram illustrating a configuration example of a semiconductor device according to a third embodiment.

Referring to FIG. 10, a semiconductor device 100C according to the third embodiment differ from semiconductor device 100A according to the first embodiment in that it includes a switch circuit 181 instead of switch circuit 180. Except for switch circuit 181, the configuration of semiconductor device 100C is similar to that of semiconductor device 100A and a detailed description will not be repeated.

In semiconductor device 100C, switch circuit 181 includes a P-type switch transistor MPSW3 and an N-type switch transistor MNSW3. On the other hand, output node No and output terminal 103 are electrically connected not through the switch transistors.

Reference voltage VREFP from disconnection detection circuit 120 (120a) is input to the gate of P-type switch transistor MPSW3, in the same manner as switch transistor MPSW in the first embodiment. Similarly, reference voltage VREFN from disconnection detection circuit 120 (120a) is input to the gate of N-type switch transistor MNSW3, in the same manner as switch transistor MNSW in the first embodiment. That is, in a normal state, each of switch transistors MNSW3 and MPSW3 is kept in the ON state.

Switch transistor MNSW3 is connected between the back gate terminal (body) and the source terminal of output transistor MPOUT on the power supply voltage VCC side. In the example of FIG. 10, switch transistor MNSW3 that is turned off at a time of occurrence of disconnection on the power supply voltage VCC side is electrically connected between the body of P-type output transistor MPOUT and power supply node NP.

Switch transistor MPSW3 is connected between the back gate terminal (body) and the source terminal of output transistor MNOUT on the ground voltage GND side. In the example of FIG. 10, switch transistor MPSW3 that is turned off at a time of occurrence of disconnection on the ground voltage GND side is electrically connected between the body of N-type output transistor MNOUT and GND node NG.

At a time of occurrence of disconnection on the power supply voltage VCC side, a current path formed by the body diode of output transistor MPOUT described with reference to FIG. 3 is cut off by turning-off of switch transistor MNSW3. Thus, a path of abnormal current Iabn1 in FIG. 3 can also be cut off by providing switch transistor MNSW3 shown in FIG. 10. That is, in the third embodiment, switch transistor MNSW3 forms "first switch transistor".

At a time of occurrence of disconnection on the ground voltage GND side, a current path formed by the body diode of output transistor MNOUT described with reference to FIG. 5 is cut off by turning-off of switch transistor MPSW3. Thus, a path of abnormal current Iabn2 in FIG. 5 can also be cut off by providing switch transistor MPSW3 shown in FIG. 10. That is, in the third embodiment, switch transistor MPSW3 forms "second switch transistor".

Therefore, even in semiconductor device 100C according to the third embodiment, the arrangement of switch circuit 181 including switch transistors MNSW3 and MPSW3 can prevent occurrence of abnormal current through a path including the pull-up resistor or the pull-down resistor connected to output terminal 103 and the body diode of output transistor MPOUT or MNOUT when disconnection occurs on the power supply voltage side or the ground voltage side.

In switch circuit 181 according to the third embodiment, in a normal state in which disconnection does not occur, switch transistor MPSW3, MNSW3 in the ON state has the function of fixing the body potential of output transistor MPOUT, MNOUT. Thus, in switch circuit 181, unlike switch circuit 180 according to the first and second embodiments, the same current as output transistor MPOUT, MNOUT (drain-source current) does not flow through the switch transistor in the ON state. As a result, the configuration of the third embodiment using switch circuit 181 can suppress power consumption and reduce output impedance in a normal state, compared with the first and second embodiments influenced by the on resistance of the switch transistor arranged between output terminal 103 and output node No.

Even in each of the second and third embodiments, in the configuration of FIG. 9 and FIG. 10, each of disconnection detection circuits 120c and 120d (FIG. 7, FIG. 8) described in the modifications of the first embodiment can be employed as disconnection detection circuit 120 instead of disconnection detection circuit 120a.

Furthermore, even in each of the second and third embodiments, as described in the first embodiment, when a circuit design premised on that only pull-up resistor 201 or pull-down resistor 202 is connected to output terminal 103 is permitted, switch circuit 181 may be configured only with one of the P-type switch transistor and the N-type switch transistor.

To sum up the first to third embodiments, it is understood that in order to prevent occurrence of abnormal current at a time of occurrence of disconnection, at least one of an N-type switch transistor inserted and connected in a first path from power supply node NP to output terminal 103 via the body diode of output transistor MPOUT on the power supply voltage side and output node No and a P-type switch transistor inserted and connected in a second path from GND node NG to output terminal 103 via the body diode of output transistor MNOUT on the ground voltage side and output node No can be arranged to prevent abnormal current at a time of occurrence of disconnection.

The third embodiment may be combined with each of the first and second embodiments.

Figure 11:
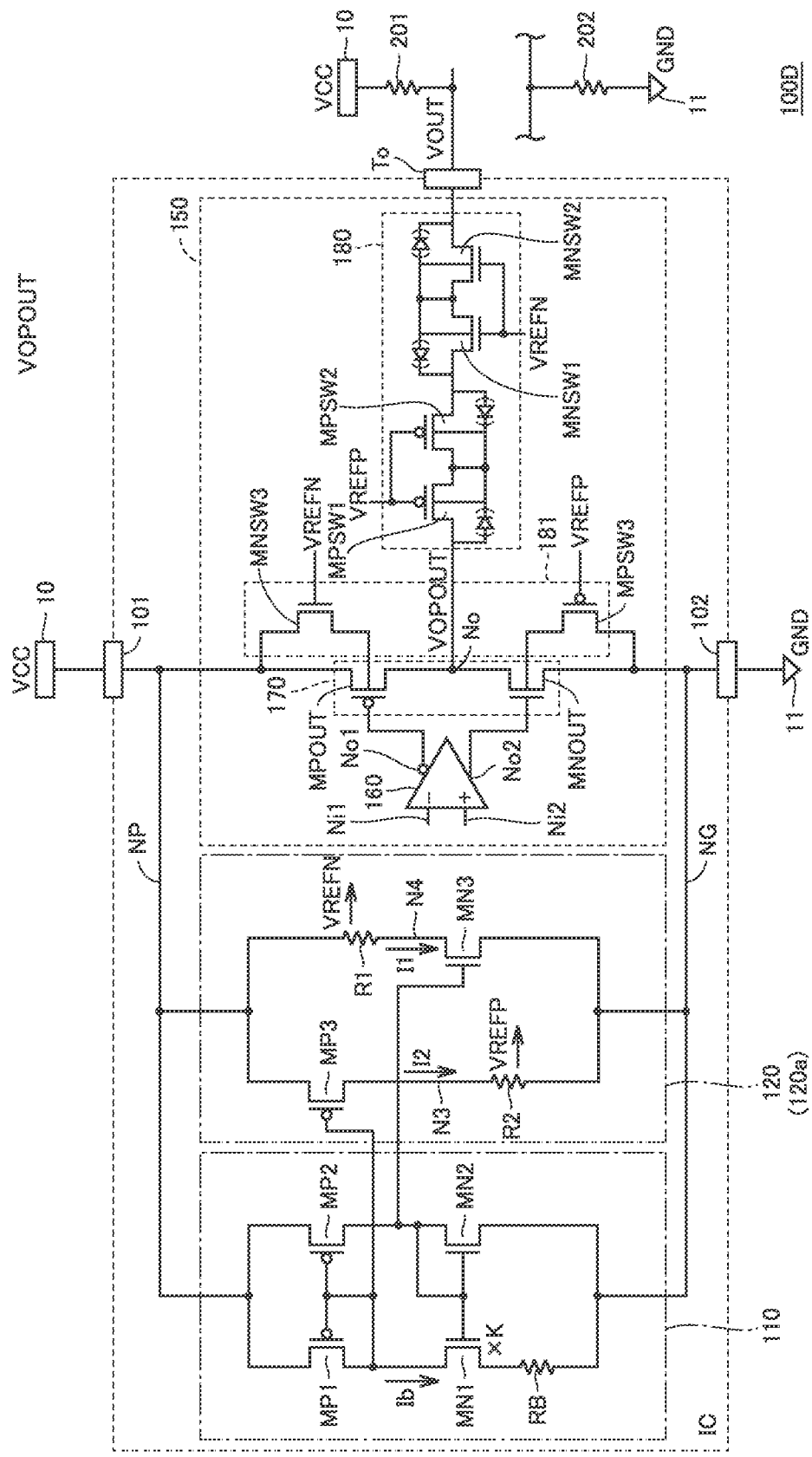
FIG. 11 is a circuit diagram illustrating a configuration example of a semiconductor device according to a combination of the second and third embodiments.

FIG. 11 is a circuit diagram illustrating a configuration example of a semiconductor device 100D according to a combination of the second and third embodiments.

Referring to FIG. 11, semiconductor device 100D differs from semiconductor device 100A according to the first embodiment in that it includes both switch circuits 180 and 181.

In semiconductor device 100D, switch circuit 180 includes P-type switch transistors MPSW1 and MPSW2 and N-type switch transistors MNSW1 and MNSW2, which are arranged in the same manner as in semiconductor device 100B (FIG. 9). Similarly, switch circuit 181 includes a P-type switch transistor MPSW3 and an N-type switch transistors MNSW3, which are arranged in the same manner as in semiconductor device 100C (FIG. 10).

A combination of the second and third embodiments can more reliably cut off a current path formed between power supply node NP or GND node NG and output terminal 103 via output node No and the body diode of output transistor MPOUT or MOPUT, at a time of occurrence of disconnection on the power supply voltage side or the ground voltage side. As a result, the effect of preventing abnormal current at a time of occurrence of disconnection can be enhanced.

Switch transistors MNSW3 and MPSW3 in FIG. 10 and FIG. 11 can also be formed with a plurality of transistors arranged such that parasitic diodes of opposite polarities are connected in series in the OFF state, in the same manner as N-type switch transistors MNSW1 and MNSW2 and P-type switch transistors MPSW1 and MPSW2 in FIG. 9. By doing so, the effect of preventing occurrence of abnormal current by turning-on of the parasitic diodes can be enhanced. In addition, it should be noted that, for the first to third embodiments described above, any combinations that are not cited in the description as well as any appropriate combinations of the configurations described in the embodiments in a range that does not cause inconsistency or contradiction are initially intended at the time of filing.

Although FIG. 1 and the like illustrate an example in which output stage 170 is formed with transistors of different conductivity types, output stage 170 may be configured with transistors of the same conductivity type in the first to third embodiments. For example, an N-type output transistor may be connected between power supply node NP and output node No. Even in this case, since the back gate terminal (body) is connected to the source terminal (that is, the output node) in the N-type output transistor, the body diode (parasitic diode) is formed of the same characteristics as the P-type output transistor explained with reference to FIG. 3. In such a configuration, therefore, occurrence of abnormal current can also be prevented by the arrangement of switch circuit 180 described in the first to third embodiments. Conversely, a P-type output transistor may be connected between output node No and GND node NG.

Fourth Embodiment

In the first to third embodiments, a configuration example in which abnormal current at a time of occurrence of disconnection is prevented by the arrangement of switch circuits 180 and 181 has been described. However, in switch circuit 180 according to the first and second embodiments, in particular, even in a normal state in which disconnection does not occur, current equivalent to that of output transistors MPOUT and MNOUT flows through the switch transistor in the ON state. Thus, in some applications, the on resistance of the switch transistor may influence the circuit operation in a normal state. In a fourth embodiment, a configuration example to cut off abnormal current at a time of occurrence of disconnection without arranging switch circuits 180 and 181 will be described.

Figure 12:
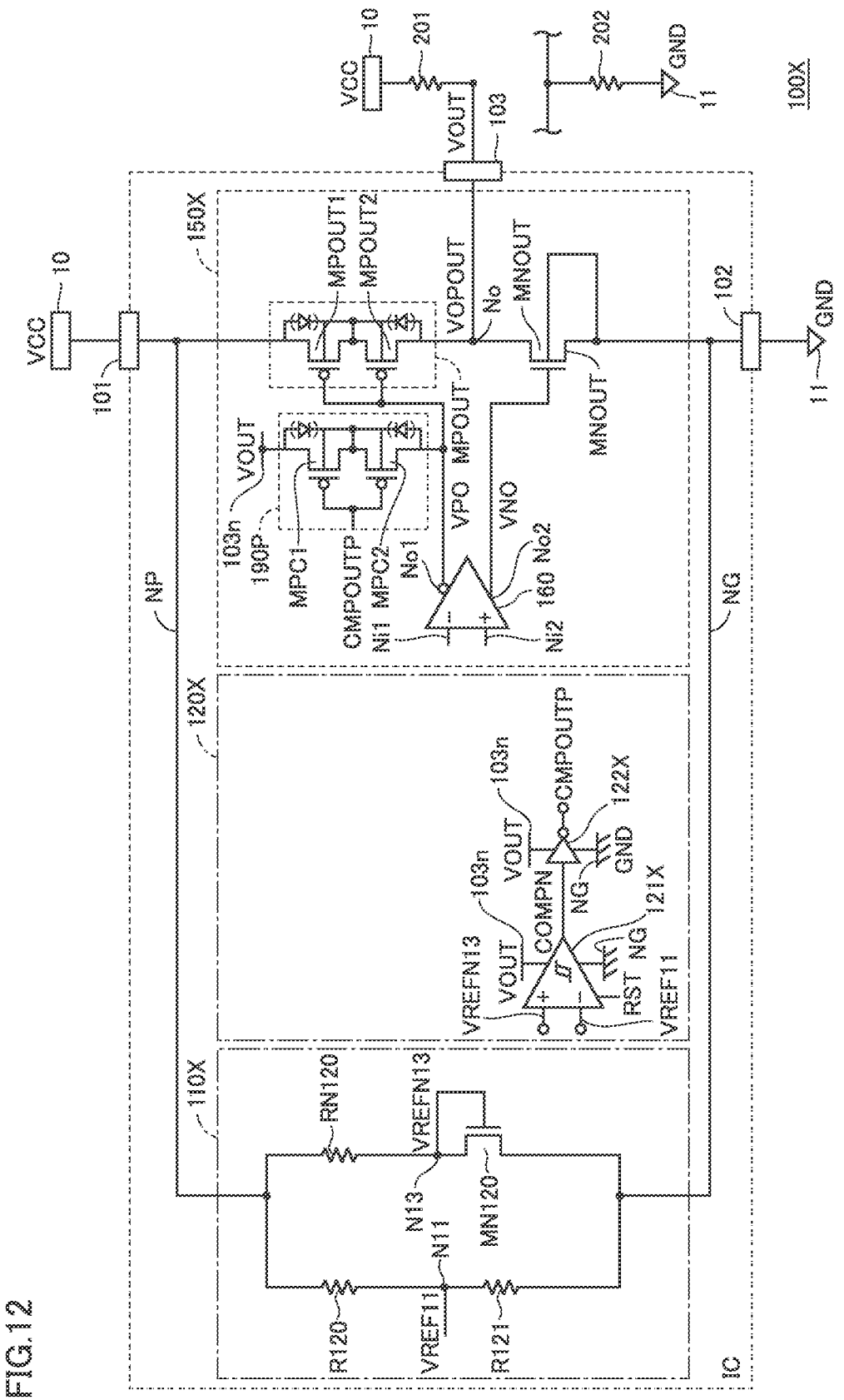
FIG. 12 is a circuit diagram illustrating a first configuration example of a semiconductor device according to a fourth embodiment.

FIG. 12 is a circuit diagram illustrating a first configuration example of the semiconductor device according to the fourth embodiment. In the first configuration example, a configuration example for addressing disconnection on the power supply voltage VCC side described with reference to FIG. 3 is shown.

Referring to FIG. 12, a semiconductor device 100X according to the first configuration example of the fourth embodiment differs from semiconductor device 100A shown in FIG. 1 in that it includes a bias circuit 110X, a disconnection detection circuit 120X, and an operational amplifier 150X, instead of bias circuit 110, disconnection detection circuit 120a, and operational amplifier 150, respectively. Operational amplifier 150X differs from operational amplifier 150 (FIG. 1) in that it includes an output transistor control circuit 190P instead of switch circuit 180. Furthermore, semiconductor device 100X differs from semiconductor device 110A in configuration of output transistor MPOUT in output stage 170.

As described with reference to FIG. 3, in the case where output terminal 103 is connected to pull-up resistor 201 on the outside of semiconductor device 100X, when disconnection occurs between power supply 10 and power supply terminal 101, the voltage at power supply node NP entering the Hi-Z state decreases toward GND (0 [V]). As a result, a path of abnormal current to power supply node NP with decreasing voltage may be continuously formed from output terminal 103 pulled up to power supply voltage VCC.

In semiconductor device 100X according to the fourth embodiment, in order to cut off the abnormal current by output transistor MPOUT in output stage 170, P-type output transistor MPOUT includes P-type transistors MPOUT1 and MPOUT2 connected in series between power supply node NP and output node No. Furthermore, the back gate terminals of transistor MPOUT1 and MPOUT2 are connected in common to the connection point (connection node) of transistors MPOUT1 and MPOUT2. That is, in semiconductor device 100X, P-type (VCC side) output transistor MPOUT is formed with a plurality of P-type transistors arranged such that body diodes (parasitic diodes) of opposite polarities are connected in series in the OFF state, as denoted by parenthesized symbols in FIG. 12.

The gates of transistors MPOUT1 and MPOUT2 forming output transistor MPOUT are further connected to output transistor control circuit 190P in addition to inversion output node Not of differential amplifier 160. On the other hand, the gate of N-type (GND side) output transistor MNOUT is connected to non-inversion output node No2 (+side) of differential amplifier 160, in the same manner as in FIG. 1.

Output transistor control circuit 190P includes P-type transistors MPC1 and MPC2. Transistors MPC1 and MPC2 are connected in series between an output voltage node 103n and the gates of transistors MPOUT1 and MPOUT2. Output voltage node 103n is electrically connected to output terminal 103 and output node No and transmits output voltage VOUT. It is therefore understood that in the case where output terminal 103 is pulled up, when disconnection occurs between power supply 10 and power supply terminal 101, VOUT=VCC is attained.

The back gate terminals of transistors MPC1 and MPC2 are connected in common to the connection point (connection node) of transistors MPC1 and MPC2. Transistors MPC1 and MPC2 are therefore connected in series in such a manner that body diodes (parasitic diodes) of opposite polarities are connected in series in the OFF state, as denoted by parenthesized symbols in FIG. 12, in the same manner as transistors MPOUT1 and MPOUT2.

A disconnection detection signal CMPOUTP from disconnection detection circuit 120X is input to the gates of transistors MPC1 and MPC2. The configuration and the operation of bias circuit 110X and disconnection detection circuit 120X for generating disconnection detection signal CMPOUTP will now be described.

Bias circuit 110X includes resistor elements R120, R121, and RN120 and an N-type transistor MN120. Resistor elements R120 and R121 are connected in series between power supply node NP and GND node NG through a node N11. At node N11, therefore, a reference voltage VREF11 is generated by dividing power supply voltage VCC by resistor elements R120 and R121. Reference voltage VREF11 is a voltage obtained by dividing a voltage difference between power supply node NP and GND node NG, that is, a voltage difference between power supply terminal 101 and ground terminal 102.

On the other hand, resistor element RN120 is connected between power supply node NP and a node N13, and transistor MN120 is connected between node N13 and GND node NG. The gate of transistor MN120 is connected to node N13. That is, transistor MN120 is diode-connected, and at node N13, a reference voltage VREF13 equivalent to a threshold voltage of transistor MN120 is generated.

Disconnection detection circuit 120X includes a one-shot comparator 121X and an inverter 122X. Comparator 121X and inverter 122Y receive output voltage VOUT from output voltage node 103n and ground voltage GND from GND node NG to operate. That is, for binary-set output signals of comparator 121X and inverter 122X, a logic low level (hereinafter "L level") is ground voltage GND, and a logic high level (hereinafter "N level") is output voltage VOUT.

In bias circuit 110X, when disconnection on the power supply voltage VCC side does not occur (in a normal state), the voltage division ratio by resistor elements R120 and R121 is set such that VREF11>VREF13. For example, since reference voltage VREF13 equivalent to a threshold voltage is approximately 1.0 [V], the voltage division ratio is set to 0.3 when power supply voltage VCC is 5 [V], so that reference voltage VREF11=1.5 [V] can be set.

When a voltage at power supply node NP decreases due to occurrence of disconnection on the power supply voltage VCC side, reference voltage VREF11 decreases in proportion to the decreasing voltage. On the other hand, while current is produced in transistor NM120, reference voltage VREF13 does not decrease even though the voltage at power supply node NP decreases. Therefore, voltage variation (decrease amount) in reference voltage VREF13 is smaller than voltage variation (decrease amount) in reference voltage VREF11, relative to the common variation amount of the voltage difference between power supply terminal 101 and ground terminal 102. That is, reference voltage VREF11 is an embodiment of "third reference voltage" while reference voltage VREF13 corresponds to an embodiment of "fourth reference voltage".

In other words, compared with reference voltage VREF11, reference voltage VREF13 has low sensitivity to the voltage variation (decrease) of power supply node NP. Thus, when disconnection occurs on the power supply voltage VCC side, the relation in level of reference voltages VREF11 and VREF13 is inverted from that of a normal state. In this way, reference voltages VREF11 and VREF13 in bias circuit 110X are monitored to detect VREF13>VREF11, whereby disconnection on the power supply voltage VCC side can be detected.

Disconnection detection circuit 120X converts the comparison result of reference voltages VREF11 and VREF13 described above into disconnection detection signal CMPOUTP used as an ON/OFF control signal for transistors MPC1 and MPC2. One-shot comparator 121X receives a reset signal RST and reference voltages VREF11 and VREF13 of bias circuit 110X to generate an output signal COMPN. Inverter 122X outputs disconnection detection signal CMPOUTP by inverting the logic level of output signal COMPN from comparator 121X.

Specifically, when reset signal RST is input, comparator 121X initializes output signal COMPN to 1 level. Then, after the reset is cleared, when reference voltage VREF13 at the (+) input terminal becomes higher than reference voltage VREF11 at the (−) input terminal, output signal COMPN changes from L level to H level. On the other hand, after the reset is cleared, while reference voltage VREF13 is lower than reference voltage VREF11, output signal COMPN is kept at L level.

Figure 13:
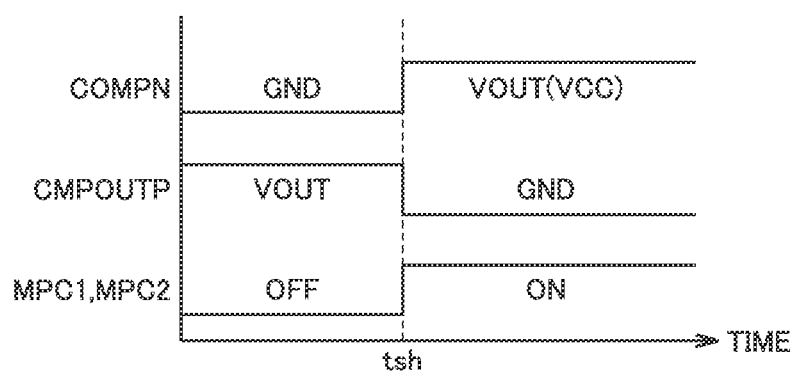
FIG. 13 is a waveform diagram illustrating operation of the semiconductor device shown in FIG. 12.

FIG. 13 shows a waveform diagram illustrating operation of disconnection detection circuit 120X and output transistor control circuit 190P in semiconductor device 100X.

Referring to FIG. 13, at the start of operation of semiconductor device 100X, with input of reset signal RST, output signal COMPN of comparator 121X is reset to L, level (GND) and therefore disconnection detection signal CMPOUTP is initialized to H level (VOUT). Subsequently, during operation of semiconductor device 100X, the reset is cleared.

it is assumed that disconnection on the power supply voltage VCC side occurs during operation of semiconductor device 100X. At this moment, based on the relation of reference voltages VREF11 and VREF13 described above, in a period until disconnection occurrence (in a normal state), VREF11>VREF13 holds and output signal COMPN is kept at L level, so that disconnection detection signal CMPOUTP is set to H level.

In comparison, it is assumed that due to occurrence of disconnection, at time tsh, the levels of reference voltages VREF11 and VREF13 are reversed. In response, output signal COMPN of comparator 121X changes from L level to 1H level (VOUT) and is kept at H level until reset signal RST is input next time. Thus, at time tsh, disconnection detection signal CMPOUTP changes from H1 level to L level (GND) and is kept at L level until reset signal RST is input to comparator 121X.

Thus, when disconnection occurs on the power supply voltage VCC side (after time tsh), P-type transistors MPC1 and MPC2 of output transistor control circuit 190P are set to the ON state because GND is input to the gates. On the other hand, in a normal state in which the disconnection does not occur (until time tsh), P-type transistors MPC1 and MPC2 are kept in the OFF state because output voltage VOUT equivalent to the source voltage is input to the gates.

Referring to FIG. 12 again, in a normal state, output transistor control circuit 190P does not operate because transistors MPC1 and MPC2 turn off. As a result, voltage VPO at inversion output node No1 of differential amplifier 160 is input to the gates of transistors MPOUT1 and MPOUT2 forming output transistor MPOUT. The operation of semiconductor device 100X in a normal state is therefore similar to that of semiconductor device 100A according to the first embodiment. That is, even in semiconductor device 100X, output transistors MPOUT and MNOUT are driven in accordance with the output ("first control voltage" and "second control voltage") of differential amplifier 160, whereby output voltage VOPOUT in accordance with the input voltage of differential amplifier 160 is produced at output node No (output terminal 103).

On the other hand, when disconnection occurs on the power supply voltage VCC side, disconnection detection signal CMPOUTP is set to L level (GND), so that transistors MPC1 and MPC2 in output transistor control circuit 190P are turned on. As a result, output voltage VOUT of output terminal 103 is input to the gates of transistors MPOUT1 and MPOUT2 forming output transistor MPOUT.

In the case where output terminal 103 is pulled up, VOUT=VCC and transistors MPOUT1 and MPOUT2 can turn off by the gate voltage (VCC) from output transistor control circuit 190P and keep the OFF state. Therefore, a current path (abnormal current Iabn1 in FIG. 3) from output terminal 103 pulled up to power supply voltage VCC to power supply node NP with decreasing voltage is cut off by output transistor MPOUT (transistors MPOUT1 and MPOUT2) turned off by output transistor control circuit 190P.

Furthermore, the path through the body diode of output transistor MPOUT is also cut off by the body diodes of opposite polarities connected in series that are formed with transistors MPOUT1 and MPOUT2. Similarly, in output transistor control circuit 190P, a current path from output voltage node 103n with the same potential as output terminal 103 via the body diodes of transistors MPC1 and MPC2 is cut off by the body diodes of opposite polarities connected in series. That is, transistors MPC1 and MPC2 correspond to an embodiment of "two sub-transistors".

As a result, even in semiconductor device 100X according to the fourth embodiment, occurrence of abnormal current can be prevented even when disconnection occurs on the power supply voltage VCC side in the case where pull-up resistor 201 is connected to output terminal 103. Furthermore, in semiconductor device 100X, since switch circuit 180 is not arranged, variations in circuit characteristics such as dynamic range and output impedance due to the on resistance in switch circuit 180 can be avoided in a normal state in which disconnection does not occur.

When power supply node NP decreases from power supply voltage VCC due to disconnection on the power supply voltage side, disconnection detection circuit 120X can promptly change the voltage level of disconnection detection signal CMPOUTP, before reference voltage VREFN (FIG. 4) in the first to third embodiments decreases to the voltage level that turns off the N-type switch transistor. In semiconductor device 100X, therefore, disconnection on the power supply voltage VCC side can be detected fast, and the circuit operation for cutting off abnormal current can be started.

Figure 14:
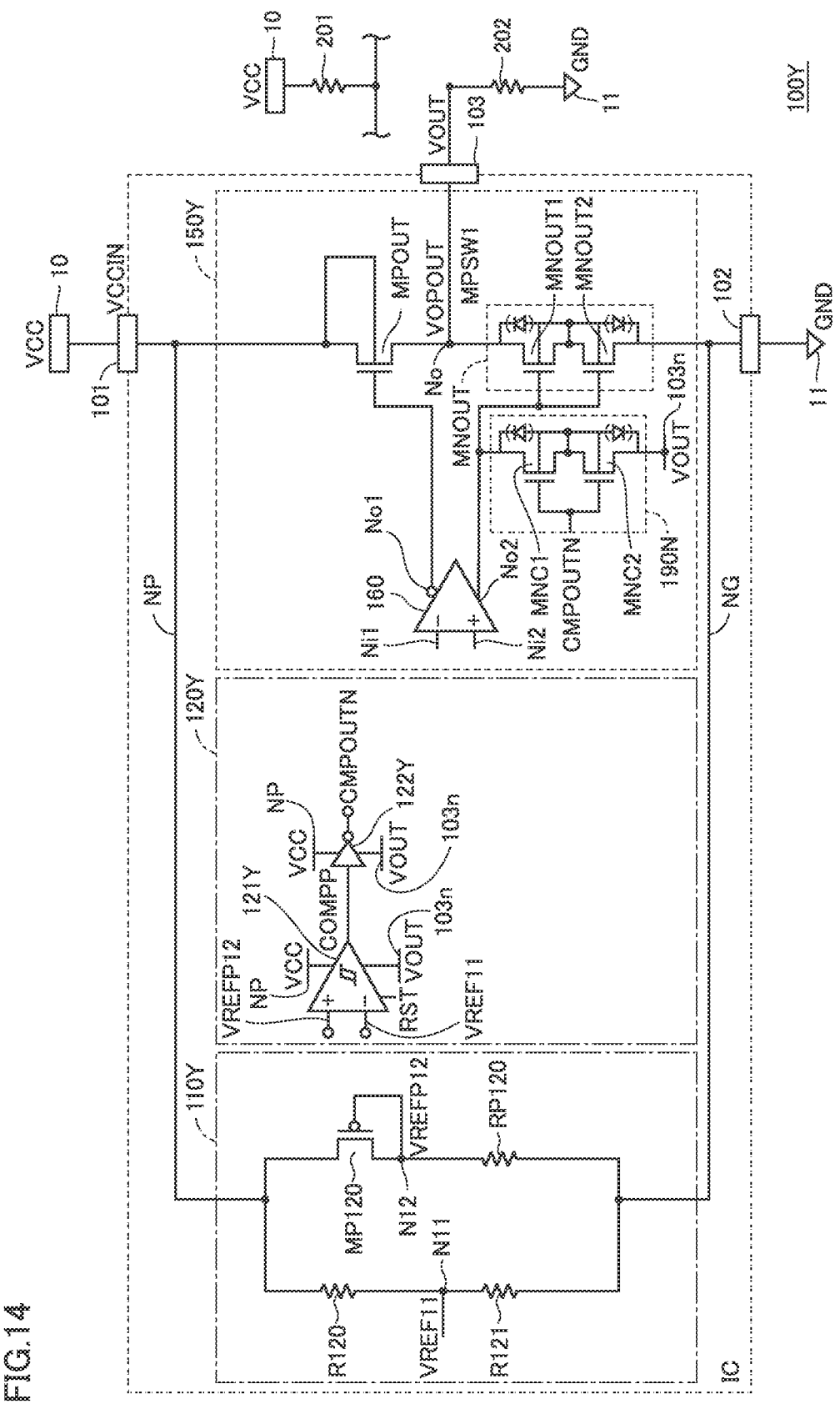
FIG. 14 is a circuit diagram illustrating a second configuration example of a semiconductor device according to the fourth embodiment.

FIG. 14 is a circuit diagram illustrating a second configuration example of the semiconductor device according to the fourth embodiment. In the second configuration example, a configuration example for addressing disconnection on the ground voltage GND side described with reference to FIG. 5 is shown.

Referring to FIG. 14, a semiconductor device 100Y according to the second configuration example of the fourth embodiment differs from semiconductor device 100X shown in FIG. 12 in that it includes a bias circuit 110Y, a disconnection detection circuit 120Y, and an operational amplifier 150Y, instead of bias circuit 110X, disconnection detection circuit 120X, and operational amplifier 150X, respectively. Operational amplifier 150Y differs from operational amplifier 150 (FIG. 1) in that it includes an output transistor control circuit 190N instead of switch circuit 180. Furthermore, semiconductor device 100Y differs from semiconductor device 100A in configuration of output transistor MNOUT in output stage 170.

As described with reference to FIG. 5, in the case where output terminal 103 is connected to pull-down resistor 202 on the outside of semiconductor device 100Y, when disconnection occurs between reference voltage node 11 and ground terminal 102, the voltage at GND node NG entering the Hi-Z state increases toward VCC (for example, 5 [V]). As a result, a path of abnormal current to output terminal 103 pulled down to ground voltage GND may be continuously formed from GND node NG with increasing voltage.

In semiconductor device 100Y according to the fourth embodiment, in order to cut off the abnormal current by output transistor MNOUT in output stage 170. N-type output transistor MNOUT includes N-type transistors MNOUT1 and MNOUT2 connected in series between output node No and GND node NG. Furthermore, the back gate terminals of transistor MNOUT1 and MNOUT2 are connected in common to the connection point (connection node) of transistors MNOUT1 and MNOUT2. That is, in semiconductor device 100Y, N-type (GND side) output transistor MNOUT is formed with a plurality of N-type transistors arranged such that body diodes (parasitic diodes) of opposite polarities are connected in series in the OFF state, as denoted by parenthesized symbols in FIG. 14.

The gates of transistors MNOUT1 and MNOUT2 forming output transistor MNOUT are further connected to output transistor control circuit 190N in addition to non-inversion output node No2 of differential amplifier 160. On the other hand, the gate of P-type (VCC side) output transistor MPOUT is connected to inversion output node No1 (−side) of differential amplifier 160, in the same manner as in FIG. 1.

Output transistor control circuit 190N includes N-type transistors MNC1 and MNC2. Transistors MNC1 and MNC2 are connected in series between the gates of transistors MNOUT1 and MNOUT2 and output voltage node 103n. It is understood that in the case where output terminal 103 is pulled down, when disconnection occurs between reference voltage node 11 and ground terminal 102, VOUT=GND is attained.

The back gate terminals of transistors MNC1 and MNC2 are connected in common to the connection point (connection node) of transistors MNC1 and MNC2. Transistors MNC1 and MNC2 are therefore connected in such a manner that body diodes (parasitic diodes) of opposite polarities are connected in series in the OFF state, as denoted by parenthesized symbols in FIG. 14, in the same manner as transistors MNOUT1 and MNOUT2.

A disconnection detection signal CMPOUTN from disconnection detection circuit 120Y is input to the gates of transistors MNC1 and MNC2. The configuration and the operation of bias circuit 110Y and disconnection detection circuit 120Y for generating disconnection detection signal CMPOUTN will now be described.

Bias circuit 110Y includes resistor elements R120. R121, and RP120 and a P-type transistor MP120. Resistor elements R120 and R121 are connected in series between power supply node NP and GND node NG through node N11, in the same manner as in bias circuit 110X in FIG. 12. At node N11, therefore, reference voltage VREF11 is generated by dividing the voltage difference between power supply terminal 101 and ground terminal 102, in the same manner as in bias circuit 110X.

On the other hand, transistor MP120 is connected between power supply node NP and node N12. Transistor MP120 is diode-connected, and at node N12, a voltage lower than power supply voltage VCC by a threshold voltage of transistor MP120 is generated as a reference voltage VREF12.

In bias circuit 110Y, when disconnection on the power supply voltage VCC side does not occur (in a normal state), the voltage division ratio by resistor elements R120 and R121 is set such that VREF11<VREF12. For example, when power supply voltage VCC is 5 [V], the threshold voltage of transistor MP120 is approximately 1.0 [V] and therefore reference voltage VREF12 is approximately 4.0 [V]. Therefore, with a voltage division ratio of 0.6, reference voltage VREF11=3.0 [V] can be set.

When a voltage at GND node NG increases due to occurrence of disconnection on the ground voltage GND side, reference voltage VREF11 increases with the increasing voltage. On the other hand, while current is produced in transistor NP120, reference voltage VREF12 does not significantly change even though the voltage at GND node NG increases. Therefore, voltage variation (increase amount) in reference voltage VREF12 is smaller than voltage variation (increase amount) in reference voltage VREF11, relative to the common variation amount of the voltage difference between power supply terminal 101 and ground terminal 102. That is, reference voltage VREF11 is an embodiment of "third reference voltage" while reference voltage VREF12 corresponds to an embodiment of "fourth reference voltage".

In other words, compared with reference voltage VREF11, reference voltage VREF12 has low sensitivity to the voltage variation (increase) of GND node NG. Thus, in bias circuit 110Y, when disconnection occurs on the ground voltage GND side, the relation in level of reference voltages VREF11 and VREF12 is inverted from that of a normal state. In this way, reference voltages VREF11 and VREF12 in bias circuit 110Y are monitored to detect VERF11>VREF12, whereby disconnection on the ground voltage side can be detected.

Disconnection detection circuit 120Y includes a one-shot comparator 121Y and an inverter 122Y. Comparator 121Y and inverter 122Y receive power supply VCC from power supply node NP and output voltage VOUT from output voltage node 103n to operate. That is, for binary-set output signals of comparator 121Y and inverter 122Y, H level is power supply voltage VCC, and L level is output voltage VOUT.

Disconnection detection circuit 120Y converts the comparison result of reference voltages VREF11 and VREF12 described above into disconnection detection signal CMPOUTN used as an ON/OFF control signal for transistors. When reset signal RST is input, one-shot comparator 121Y initializes output signal COMPP to H level, in the same manner as comparator 121X. Then, after the reset is cleared, when reference voltage VREF11 at the (−) input terminal becomes higher than reference voltage VREF12 at the (+) input terminal, output signal COMPP changes from H level to L level. On the other hand, after the reset is cleared, while reference voltage VREF12 is higher than reference voltage VREF11, output signal COMPN is kept at H level.

Inverter 122Y outputs disconnection detection signal CMPOUTP by inverting the logic level of output signal COMPP from comparator 121Y.

Figure 15:
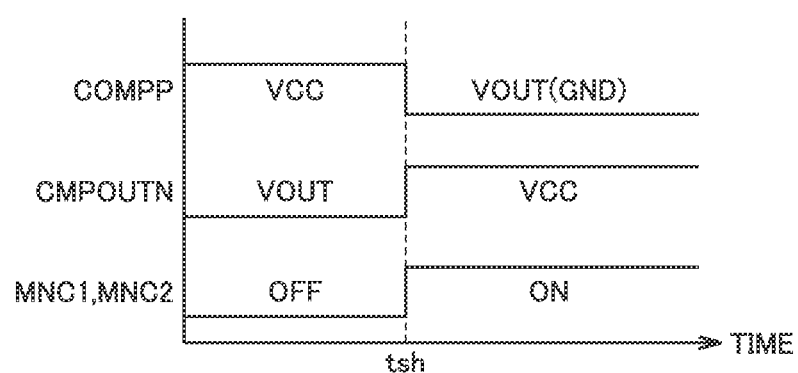
FIG. 15 is a waveform diagram illustrating operation of the semiconductor device shown in FIG. 14.

FIG. 15 shows a waveform diagram illustrating operation of disconnection detection circuit 120Y and output transistor control circuit 190N in semiconductor device 100Y.

Referring to FIG. 15, at the start of operation of semiconductor device 100Y, with input of reset signal RST, output signal COMPP of comparator 121Y is reset to H level (VCC) and therefore disconnection detection signal CMPOUTP is initialized to L level (VOUT). Subsequently, during operation of semiconductor device 100Y, the reset is cleared.

It is assumed that disconnection on the ground voltage GND side occurs during operation of semiconductor device 100Y. At this moment, based on the relation of reference voltages VREF11 and VREF12 described above, in a period until disconnection occurrence (in a normal state). VREF11<VREF12 holds and therefore output signal COMPP is kept at H level, so that disconnection detection signal CMPOUTN is set to L level.

In comparison, it is assumed that due to occurrence of disconnection, at time tsh, the levels of reference voltages VREF11 and VREF12 are reversed. In response, output signal COMPP of comparator 121Y changes from H level to L level (VOUT) and is kept at L level until reset signal RST is input next time. Thus, disconnection detection signal CMPOUTN changes from L level to H level (VCC) at time tsh and is kept at H level until reset signal RST is input to comparator 121Y.

Thus, when disconnection occurs on the ground voltage GND side (after time tsh). N-type transistors MNC1 and MNC2 of output transistor control circuit 190N are set in the ON state because VCC is input to the gates. On the other hand, in a normal state in which the disconnection does not occur (until time tsh), N-type transistors MNC1 and MNC2 are kept in the OFF state because output voltage VOUT equivalent to the source voltage is input to the gates.

Referring to FIG. 14 again, in a normal state, output transistor control circuit 190N does not operate because transistors MNC1 and MNC2 turn off. As a result, voltage VNO at non-inversion output node No2 of differential amplifier 160 is input to the gates of transistors MNOUT1 and MNOUT2 forming output transistor MNOUT. The operation of semiconductor device 100Y in a normal state is therefore similar to that of semiconductor device 100A according to the first embodiment. That is, even in semiconductor device 100Y, output transistors MPOUT and MNOUT1 are driven in accordance with the output ("first control voltage" and "second control voltage") of differential amplifier 160, whereby output voltage VOPOUT in accordance with the input voltage of differential amplifier 160 is produced at output node No (output terminal 103).

On the other hand, when disconnection occurs on the ground voltage GND side, disconnection detection signal CMPOUTN is set to H level (VCC), so that transistors MNC1 and MNC2 in output transistor control circuit 190N are turned on. As a result, output voltage VOUT of output terminal 103 is input to the gates of transistors MNOUT1 and MNOUT2 forming output transistor MNOUT.

In the case where output terminal 103 is pulled down, VOUT=GND holds and therefore transistors MNOUT1 and MNOUT2 can be turned off by the gate voltage (GND) from output transistor control circuit 190N and keep the OFF state. Therefore, a current path (abnormal current Iabn2 in FIG. 5) from GND node NG with increasing voltage to output terminal 103 pulled down to ground voltage GND is cut off by output transistor MNOUT (transistors MNOUT1 and MNOUT2) turned off by output transistor control circuit 190N.

Furthermore, the current path through the body diodes of output transistor MNOUT is cut off by the body diodes of opposite polarities connected in series that are formed with transistors MNOUT1 and MNOUT2. Similarly, in output transistor control circuit 190N, a current path to output voltage node 103n with the same potential as output terminal 103 via the body diodes of transistors MNC1 and MNC2 is cut off by the body diodes of opposite polarities connected in series. That is, transistors MNC1 and MNC2 correspond to an embodiment of "two sub-transistors".

As a result, even in semiconductor device 100Y according to the fourth embodiment, occurrence of abnormal current can be prevented even when disconnection occurs on the ground voltage GND side in the case where pull-down resistor 202 is connected to output terminal 103. Furthermore, in semiconductor device 100Y, since switch circuit 180 is not arranged, variations in circuit characteristics such as dynamic range and output impedance due to the on resistance in switch circuit 180 can be avoided in a normal state in which disconnection does not occur.

When the voltage at GND node NO increases from ground voltage GND due to disconnection on the ground voltage side, disconnection detection circuit 120Y can promptly change the voltage level of disconnection detection signal CMPVOUTN, before reference voltage VREFP (FIG. 6) in the first to third embodiments increases to the voltage level that turns off the P-type switch transistor. In semiconductor device 100X, therefore, disconnection on the ground voltage GND side can be detected fast, and the circuit operation for cutting off abnormal current can be started.

Figure 16:
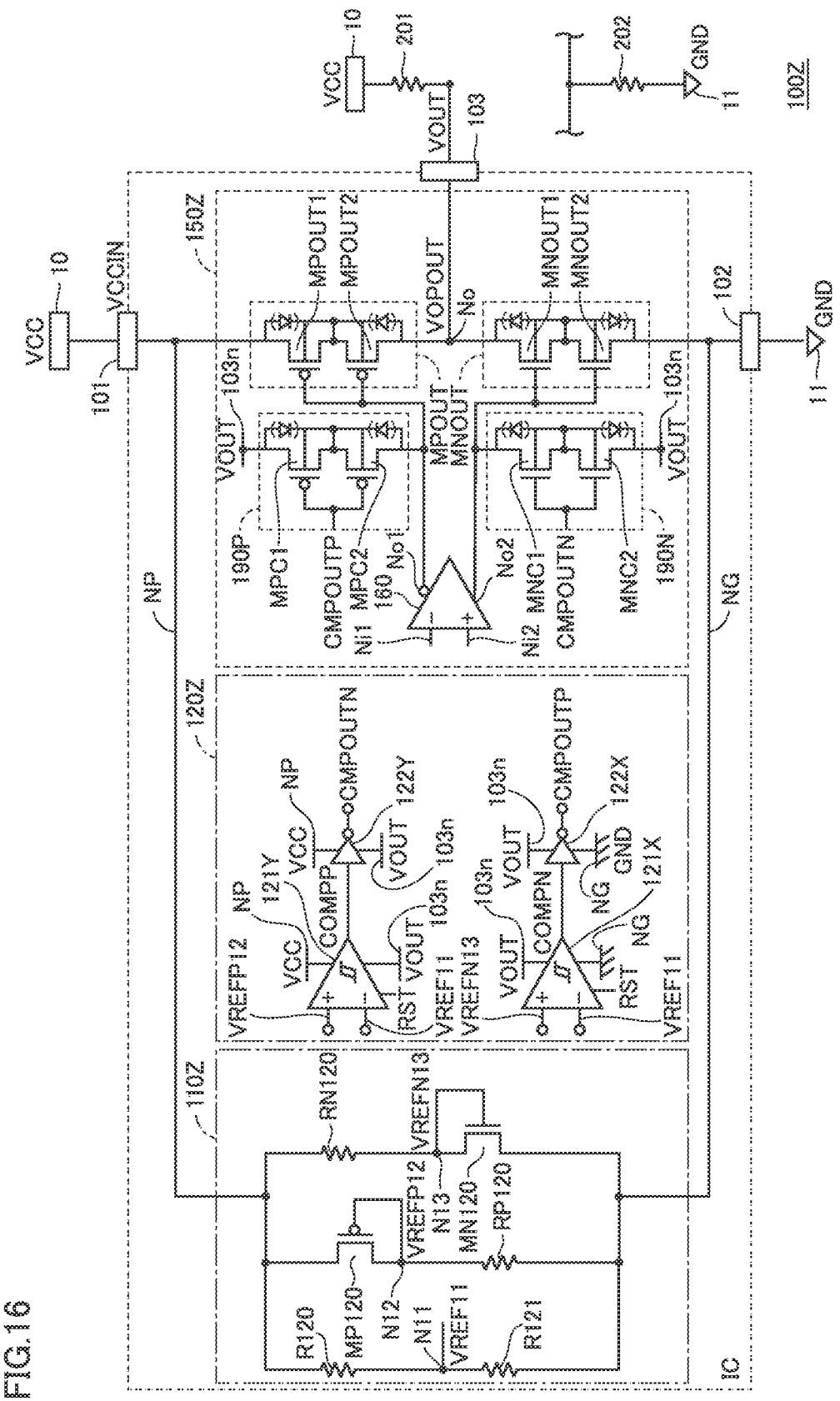
FIG. 16 is a circuit diagram illustrating a third configuration example of a semiconductor device according to the fourth embodiment.

FIG. 16 is a circuit diagram illustrating a third configuration example of the semiconductor device according to the fourth embodiment. In the third configuration example, a configuration example for addressing both of disconnection on the power supply voltage side and disconnection on the ground voltage side is shown.

Referring to FIG. 16, a semiconductor device 100Z according to the third configuration example of the fourth embodiment differs from semiconductor device 100X shown in FIG. 12 in that it includes a bias circuit 110Z, a disconnection detection circuit 120Z, and an operational amplifier 150Z instead of bias circuit 110X, disconnection detection circuit 120X, and operational amplifier 150X, respectively.

Bias circuit 110Z has a configuration of bias circuits 110X and 110Y in combination and can generate all of reference voltages VREF11, VREF12, and VREF13 described with reference to FIG. 12 and FIG. 14.

Disconnection detection circuit 120Z has a configuration of disconnection detection circuits 120X and 120Y in combination and includes one-shot comparators 121X and 121Y and inverters 122X and 122Y shown in FIG. 12 and FIG. 14. Disconnection detection circuit 120Z therefore can generate both of disconnection detection signal CMPOUTP on the power supply voltage VCC side and disconnection detection signal CMPOUTN on the ground voltage GND side. That is, disconnection detection circuit 120Z can detect both of disconnection on the power supply voltage side and disconnection on the ground voltage side fast.

Operational amplifier 150Z does not include switch circuit 180 and includes both of output transistor control circuit 190P similar to that in FIG. 12 and output transistor control circuit 190N similar to that in FIG. 14. That is, in FIG. 16, output transistor control circuits 190P and 190N are arranged corresponding to output transistors MOUTP and MOUTN, respectively. Furthermore, output transistor MPOUT is formed with transistors MPOUT1 and MPOUT2 similar to those in FIG. 12, and output transistor MNOUT is formed with transistors MNOUT1 and MNOUT2 similar to those in FIG. 14.

In semiconductor device 100Z, in the case where pull-up resistor 201 is connected to output terminal 103, when disconnection occurs on the power supply voltage VCC side, output transistor control circuit 190P operates in accordance with disconnection detection signal CMPOUTP, whereby output transistor MPOUT (transistors MPOUT1 and MPOUT2) can be turned off using output voltage VOUT (VCC) from output terminal 103. Furthermore, the current path through the body diodes of output transistor MPOUT is also cut off by the body diodes of opposite polarities connected in series that are formed with transistors MPOUT1 and MPOUT2.

On the other hand, in semiconductor device 100Z in the case where pull-down resistor 202 is connected to output terminal 103, when disconnection occurs on the ground voltage GND side, output transistor control circuit 190N operates in accordance with disconnection detection signal CMPOUTN, whereby output transistor MNOUT (transistors MNOUT1 and MNOUT2) can be turned of fusing output voltage VOUT (GND) from output terminal 103. Furthermore, the current path through the body diodes of output transistor MNOUT is also cut off by the body diodes of opposite polarities connected in series that are formed with transistors MNOUT1 and MNOUT2.

As a result, in semiconductor device 100Z, abnormal current at a time of disconnection can be prevented when either of pull-up resistor 201 and pull-down resistor 202 is connected to output terminal 103.

When a circuit design premised on that only pull-up resistor 201 is connected to output terminal 103 (pull-down resistor 202 is not connected) is permitted, semiconductor device 100X (FIG. 12) can be employed to reduce circuit elements. Similarly, when a circuit design premised on that only pull-down resistor 202 is connected to output terminal 103 (pull-up resistor 201 is not connected) is permitted, semiconductor device 100Y (FIG. 14) can be employed to reduce circuit elements.

Modifications to Fourth Embodiment

The disconnection detection described in the fourth embodiment can be applied to the first to third embodiments. In modifications to the fourth embodiment, a combination of disconnection detection according to the fourth embodiment and a configuration of the semiconductor device according to the first to third embodiments will be described.

Figure 17:
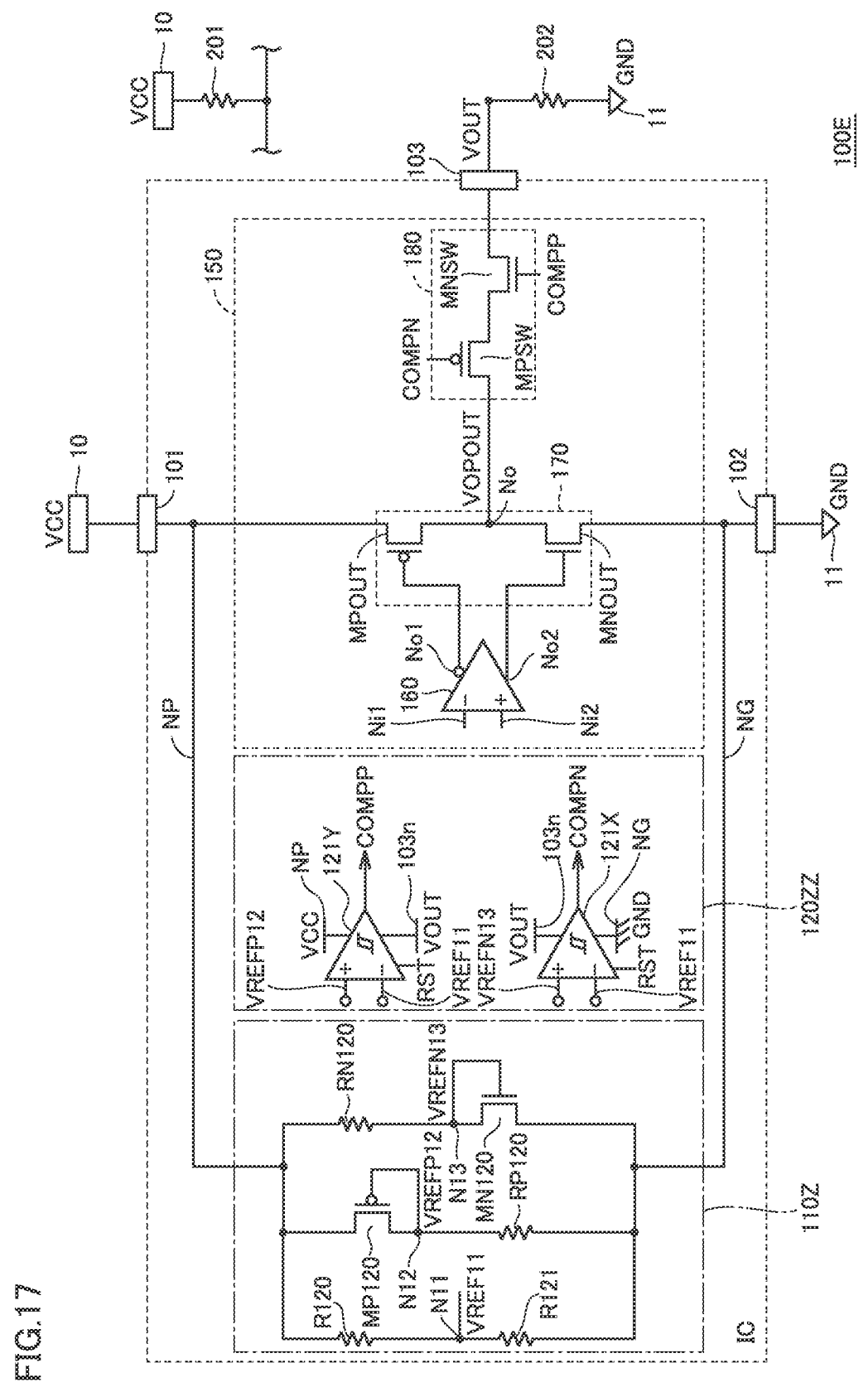

FIG. 17 is a circuit diagram illustrating a configuration example of a semiconductor device according to a first configuration example of the modification to the fourth embodiment.

Referring to FIG. 17, a semiconductor device 100E according to the first configuration example of the modification to the fourth embodiment differs from semiconductor device 100A shown in FIG. 1 in that it includes a bias circuit 110Z and a disconnection detection circuit 120ZZ similar to those in FIG. 16 instead of bias circuit I10 and disconnection detection circuit 120a.

Disconnection detection circuit 120ZZ includes one-shot comparators 121X and 121Y in disconnection detection circuit 120Z in FIG. 16. Disconnection detection circuit 120ZZ applies output signal COMPN of comparator 121X to the gate of switch transistor MPSW in switch circuit 180. Furthermore, output signal COMPP of comparator 121Y is input from disconnection detection circuit 120ZZ to the gate of switch transistor MNSW in switch circuit 180.

As shown in FIG. 13 and FIG. 15, at a time of non-occurrence of disconnection, output signal COMPN is L level (GND) and output signal COMPP is H level (VCC). In switch circuit 180, therefore, both of switch transistors MPSW and MNSW connected in series are turned on, in the same manner as the operation of semiconductor device 10A.

On the other hand, when disconnection occurs on the power supply voltage VCC side, output signal COMPN changes from L level (GND) to H level (VOUT) and is kept at H level until reset signal RST is input next time, as shown in FIG. 13. Thus, when output terminal 103 is pulled up in the case where disconnection occurs on the power supply voltage VCC side, switch transistor MPSW receiving output signal VCOMPN is turned off, whereby switch circuit 180 can cut off abnormal current Iabn1 shown in FIG. 3. That is, in semiconductor device 100E in FIG. 17, switch transistor MPSW forms "first switch transistor", and the voltage level of output signal COMPN corresponds to an embodiment of "first reference voltage".

Similarly, when disconnection occurs on the ground voltage GND side, output signal COMPP changes from H level (VCC) to L level (VOUT) and is kept at L level until reset signal RST is input next time, as shown in FIG. 15. Thus, when output terminal 103 is pulled down in the case where disconnection occurs on the ground voltage GND side, switch transistor MNSW receiving output signal VCOMPP is turned off, whereby switch circuit 180 can cut off abnormal current Iabn2 shown in FIG. 5. That is, in semiconductor device 100E in FIG. 17, switch transistor MNSW forms "second switch transistor", and the voltage level of output signal COMPP corresponds to an embodiment of "second reference voltage".

In this way, in semiconductor device 10E, switch circuit 180 including both of P-type switch transistor MPSW and N-type switch transistor MNSW operates in response to output signals COMPN and COMPP from disconnection detection circuit 120ZZ, whereby abnormal current can be cut off in the same manner as semiconductor device 100A. In particular, by using disconnection detection circuit 120ZZ, the switch transistor can be turned off fast and reliably by output voltage VOUT at a time of occurrence of disconnection.

Figure 18:
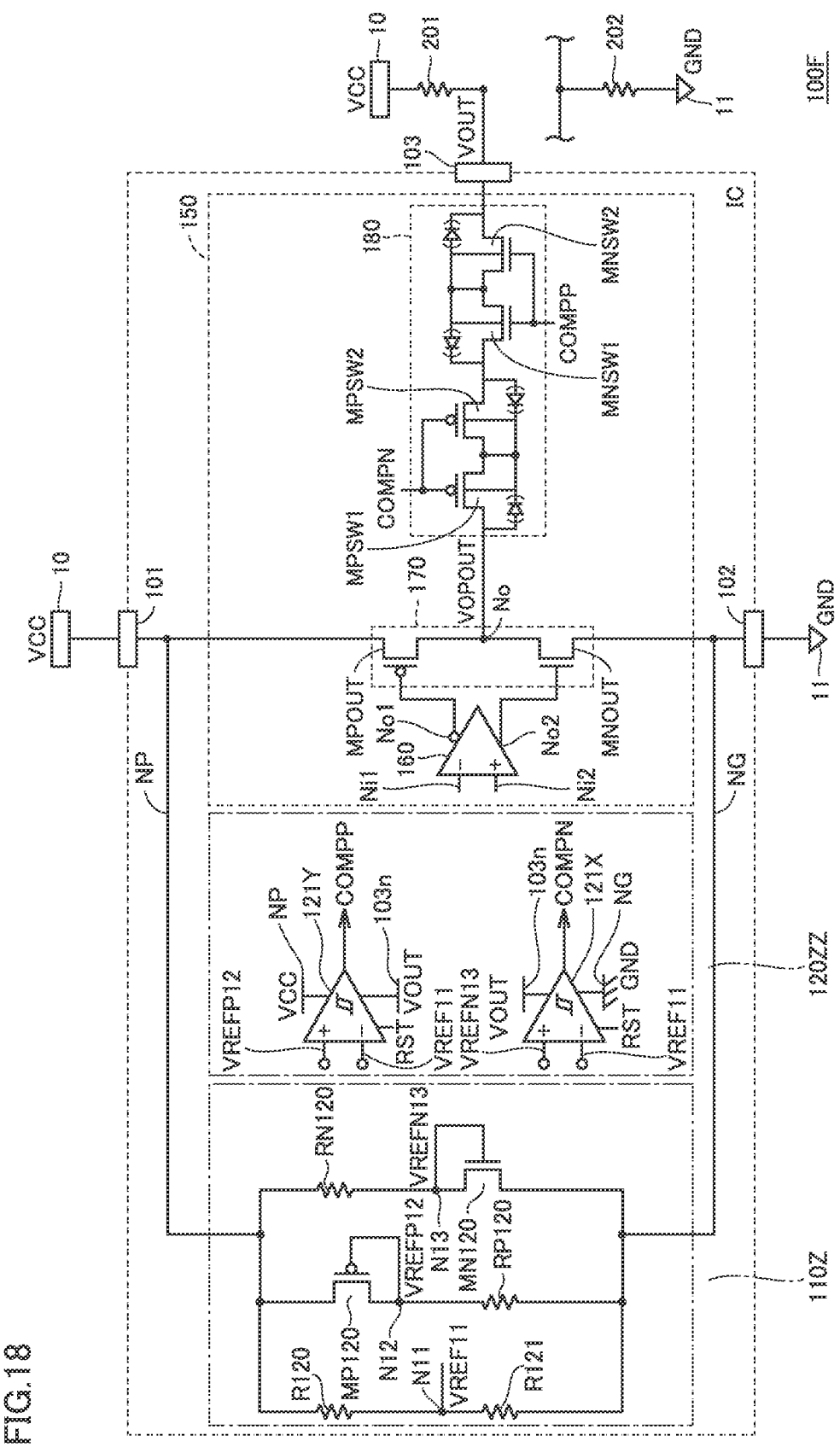
FIG. 18 is a circuit diagram illustrating a second configuration example of a semiconductor device according to a modification to the fourth embodiment.

FIG. 18 is a circuit diagram illustrating a configuration example of a semiconductor device according to a second configuration example of the modification to the fourth embodiment.

Referring to FIG. 18, a semiconductor device 100F according to the second configuration example of the modification to the fourth embodiment differs from semiconductor device 100E shown in FIG. 17 in that switch circuit 180 is formed with both of P-type switch transistors MPSW1 and MPSW2 connected in series and N-type switch transistors MNSW1 and MNSW2 connected in series, in the same manner as the second embodiment (FIG. 9).

Output signal COMPN of comparator 121X is input from disconnection detection circuit 120ZZ to the respective gates of P-type switch transistors MPSW1 and MPSW2, in the same manner as in switch transistor MPSW in semiconductor device 100E (FIG. 17).

Similarly, output signal COMPP of comparator 121Y is input from disconnection detection circuit 120ZZ to the respective gates of N-type switch transistors MNSW1 and MNSW2, in the same manner as in switch transistor MNSW in semiconductor device 100E (FIG. 17).

Therefore, even in semiconductor device 100F, at a time of non-occurrence of disconnection, all of MPSW1, MPSW2, MNSW1, and MNSW2 connected in series turn on in switch circuit 180 in accordance with output signals COMPN (GND) and COMPP (VCC), in the same manner as in semiconductor device 1003 (FIG. 9).

On the other hand, upon occurrence of disconnection on the power supply voltage VCC side, in response to output signal COMPN changing from L level (GND) to H level (VOUT), switch transistors MPSW1 and MPSW2 connected in series can be turned off when output terminal 103 is pulled up. As a result, abnormal current Iabn1 shown in FIG. 3 can be cut off by switch circuit 180, in the same manner as in semiconductor device 100B (FIG. 9). That is, in semiconductor device 100F in FIG. 18, switch transistors MPSW1 and MPSW2 form "first switch transistor", and the voltage level of output signal COMPN corresponds to an embodiment of "first reference voltage".

Similarly, upon occurrence of disconnection on the ground voltage GND side, in response to output signal COMPP changing from H level (VCC) to L level (VOUT), switch transistors MNSW1 and MNSW2 connected in series can be turned off when output terminal 103 is pulled down. As a result, abnormal current Iabn2 shown in FIG. 5 can be cut off by switch circuit 180, in the same manner as in semiconductor device 100B (FIG. 9). That is, in semiconductor device 100F in FIG. 18, switch transistors MNSW1 and MNSW2 form "second switch transistor", and the voltage level of output signal COMPP corresponds to an embodiment of "second reference voltage".

In this way, even in semiconductor device 100F, switch circuit 180 including both of P-type switch transistors MPSW1 and MPSW2 and N-type switch transistors MNSW1 and MNSW2 operates in response to output signals COMPN and COMPP from disconnection detection circuit 120ZZ, whereby abnormal current can be cut off in the same manner as semiconductor device 100B. In particular, by using disconnection detection circuit 120ZZ, the switch transistor can be turned off fast and reliably by output voltage VOUT at a time of occurrence of disconnection.

Figure 19:
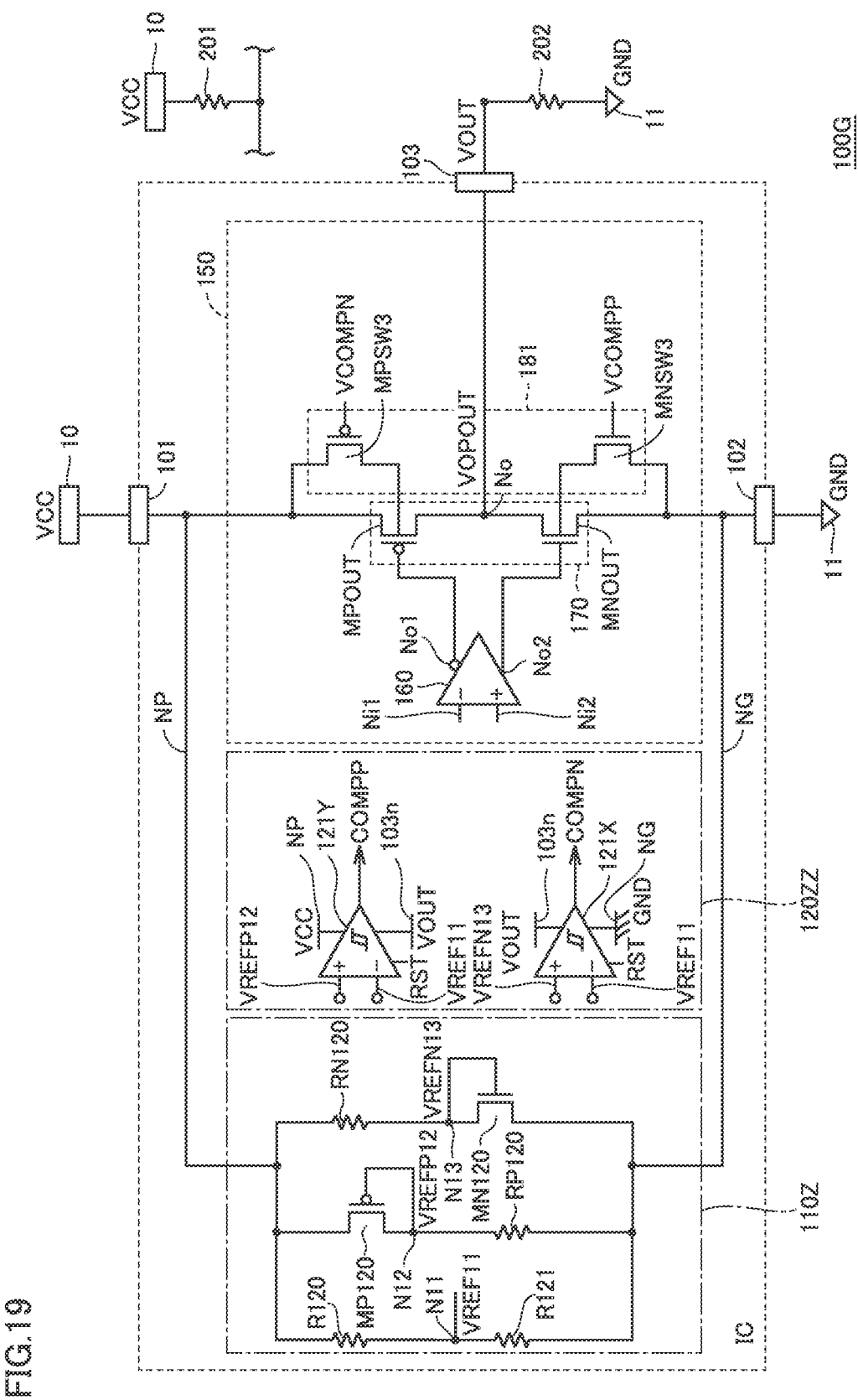
FIG. 19 is a circuit diagram illustrating a third configuration example of a semiconductor device according to a modification to the fourth embodiment.

FIG. 19 is a circuit diagram illustrating a configuration example of a semiconductor device according to a third configuration example of the modification to the fourth embodiment.

Referring to FIG. 19, a semiconductor device 100G according to the third configuration example of the modification to the fourth embodiment differs from semiconductor device 100C shown in FIG. 10 in that it includes bias circuit 110 and disconnection detection circuit 120ZZ similar to those in FIG. 16, instead of bias circuit 110 and disconnection detection circuit 120a.

Furthermore, in switch circuit 181, compared with semiconductor device 100C in FIG. 10, the arrangement of switch transistors MNSW3 and MPSW3 is interchanged. That is, switch transistor MPSW3 is connected between the back gate terminal (body) and the source terminal of output transistor MPOUT on the power supply voltage VCC side. Furthermore, switch transistor MNSW3 is connected between the back gate terminal (body) and the source terminal of output transistor MNOUT on the ground voltage GND side.

Output signal COMPN of comparator 121X is input from disconnection detection circuit 120ZZ to the gate of P-type switch transistor MPSW3, in the same manner as in switch transistor MPSW in semiconductor device 100E (FIG. 17). Output signal COMPP of comparator 121Y is input from disconnection detection circuit 120ZZ to the gate of N-type switch transistor MNSW3, in the same manner as in switch transistor MNSW in semiconductor device 100E (FIG. 17).

Therefore, even in semiconductor device 100G, at a time of non-occurrence of disconnection, both of switch transistors MPSW3 and MNSW3 turn on in switch circuit 181 in accordance with output signals COMPN (GND) and COMPP (VCC), in the same manner as in semiconductor device 100C (FIG. 10).

On the other hand, at a time of occurrence of disconnection on the power supply voltage VCC side, in response to output signal COMPN changing from L level (GND) to H level (VOUT), switch transistor MPSW3 is turned off when output terminal 103 is pulled up. Thus, switch circuit 181 can cut off abnormal current Iabn1 in FIG. 3 by cutting off a current path formed by the body diode of output transistor MPOUT. That is, in semiconductor device 100G in FIG. 19, switch transistor MPSW3 forms "first switch transistor", and the voltage level of output signal COMPN corresponds to an embodiment of "first reference voltage".

Similarly, at a time of occurrence of disconnection on the ground voltage GND side, in response to output signal COMPP changing from H level (VCC) to L level (VOUT), switch transistor MNSW3 is turned off when output terminal 103 is pulled down. Thus, switch circuit 181 can cut off abnormal current Iabn2 in FIG. 5 by cutting off a current path formed by the body diode of output transistor MNOUT. That is, in semiconductor device 100G in FIG. 19, switch transistor MNSW3 forms "second switch transistor", and the voltage level of output signal COMPP corresponds to an embodiment of "second reference voltage".

In this way, even in semiconductor device 100G, switch circuit 181 including both of P-type switch transistor MPSW3 and N-type switch transistor MNSW3 connected to the back gate terminals (bodies) of output transistors MPOUT and MNOUT, respectively, operates in response to output signals COMPN and COMPP from disconnection detection circuit 120ZZ, whereby abnormal current can be cut off in the same manner as semiconductor device 100C. In particular, by using disconnection detection circuit 120ZZ, the switch transistor can be turned off fast and reliably by output voltage VOUT at a time of occurrence of disconnection.

In the modification to the fourth embodiment, an output signal from the comparator that compares reference voltage VREF11 with reference voltage VREF12 or VREF13 is used in control of switch circuit 180, instead of reference voltages VREFN and VREFP (the first to third embodiments) that are analog voltages produced at the nodes in the circuit, whereby an abnormal current path can be cut off fast and reliably at a time of occurrence of disconnection.

Although not illustrated in the drawings, the disconnection detection according to the fourth embodiment can be applied to semiconductor device 100D (FIG. 11) according to a combination of the second and third embodiments. In this case, in the configuration of a combination of switch circuits 180 and 181 respectively shown FIG. 18 and FIG. 19, output signal COMPP of comparator 121Y can be input to the respective gates of N-type switch transistors MNSW1 to MNSW3, and output signal COMPN of comparator 121X can be input to the respective gates of P-type switch transistors MPSW1 to MPSW3. In this way, in a combination of the first to third embodiments within a range that does not cause inconsistency or contradiction as described above, switch circuit 180 including both of P-type and N-type switch transistors can operate in response to output signals COMPN and COMPP from disconnection detection circuit 120ZZ.

FIG. 1 and the like illustrates a circuit configuration in which an output voltage of differential amplifier 160 is input to output stage 170 (output transistors MPOUT and MNOUT). However, the present embodiment can be applied to a configuration in which an output voltage from any circuit block including differential amplifier 160 is input to output stage 170. In other words, the switch transistors described in the present embodiment can be arranged without limiting a circuit block arranged in the preceding stage of output stage 170 to generate "first control voltage" and "second control voltage" input to the gates of output transistors MPOUT and MNOUT in FIG. 1 and the like.

In particular, in semiconductor devices 100A to 100G and 100X to 100Z described above, a configuration of analog output has been illustrated, in which an output voltage of differential amplifier 160 is input to output stage 170. However, even in a semiconductor device with digital output, the configuration described in the first to fourth embodiments can be applied to prevent abnormal current at a time of occurrence of disconnection. That is, in the preceding stage to output stage 170, a circuit block that outputs "first control voltage" and "second control voltage" may be arranged such that each of output transistors MPOUT and MNOUT is turned on (current>0) or off (current=0).

Embodiments disclosed here should be understood as being illustrative rather than being limitative in all respects. The scope of the present invention is shown not in the foregoing description but in the claims, and it is intended that all modifications that come within the meaning and range of equivalence to the claims are embraced here.

REFERENCE SIGNS LIST 10 power supply, 11 reference voltage node, 100A to 100G, 100X to 100Z semiconductor device, 101 power supply terminal, 102 ground terminal, 103 output terminal, 103n output voltage node. 110, 110 to 110Z bias circuit, 120, 120a. 120c. 120d, 120X to 120Z. 120ZZ disconnection detection circuit, 121X, 121Y comparator. 122X, 122Y inverter, 150, 150X to 150Z operational amplifier. 160 differential amplifier, 170 output stage. 180, 181 switch circuit. 190N, 190P output transistor control circuit, 201 pull-up resistor. 202 pull-down resistor, CMPOUTN. CMPOUTP disconnection detection signal, COMPN. COMPP output signal (comparator), GND ground voltage, 11, 12, Ib current, Iabn1, Iabn2 abnormal current, MN1 to MN4, MN120, MNC1, MNC2. MNOUT1, MNOUT2 transistor (N type), MP1 to MP4, MP120, MPC1, MPC2, MPOUT1. MPOUT2 transistor (P type), MNOUT, MPOUT output transistor. MNSW, MNSW1 to 3, MPSW, MPSW1 to MPSW3 switch transistor, N1 to N4, Nrn, Nrp node, NG GND node. NP power supply node, Ni1 inversion input node (differential amplifier), Ni2 non-inversion input node (differential amplifier), No output node, No1 inversion output node (differential amplifier), No2 non-inversion output node (differential amplifier), R1, R2 resistor, VCC power supply voltage, VOUT output voltage. VREF11 to VREF13, VREFN, VREFP reference voltage.

The invention claimed is:
1. A semiconductor device comprising:
a first power supply terminal receiving a first power supply voltage;
a second power supply terminal receiving a second power supply voltage lower than the first power supply voltage;
a first output transistor connected between the first power supply terminal and an output node, the first output transistor allowing current in accordance with a first control voltage to flow from the first power supply terminal to the output node;
a second output transistor connected between the output node and the second power supply terminal, the second output transistor allowing current in accordance with a second control voltage to flow from the output node to the second power supply terminal;
an output terminal electrically connected to the output node, the output terminal being capable of electrical contact from outside of the semiconductor device;
a disconnection detection circuit to detect at least one of first disconnection in an input path of the first power supply voltage to the first power supply terminal and second disconnection in an input path of the second power supply voltage to the second power supply terminal; and
an output transistor control circuit arranged corresponding to at least one of the first and second output transistors, wherein
the first output transistor has a conductivity type to turn off when the first power supply voltage is input to a gate,
the second output transistor has a conductivity type to turn off when the second power supply voltage is input to a gate,
the output transistor control circuit arranged corresponding to the first output transistor inputs a voltage at the output terminal to the gate of the first output transistor at a time of occurrence of the first disconnection,
the output transistor control circuit arranged corresponding to the second output transistor inputs a voltage at the output terminal to the gate of the second output transistor at a time of occurrence of the second disconnection,
of the first and second output transistors, the output transistor for which the output transistor control circuit is arranged includes two transistors of a same conductivity type connected in series, and
the two transistors have back gate terminals connected in common to a connection node of the two transistors.
2. The semiconductor device according to claim 1, wherein
the output transistor control circuit arranged corresponding to the first output transistor transmits a voltage at the output terminal to the gate of the first output transistor at a time of occurrence of the first disconnection and isolates an output voltage node transmitting a voltage at the output terminal from the gate of the first output transistor at a time of non-occurrence of the first disconnection, in accordance with an output signal from the disconnection detection circuit, and
the output transistor control circuit arranged corresponding to the second output transistor transmits a voltage at the output terminal to the gate of the second output transistor at a time of occurrence of the second disconnection and isolates the output voltage node from the gate of the second output transistor at a time of non-occurrence of the second disconnection, in accordance with an output signal from the disconnection detection circuit.
3. The semiconductor device according to claim 2, wherein
the output transistor control circuit includes two sub-transistors of a same conductivity type connected in series between the output voltage node and the gate of the first or second output transistor,
the two sub-transistors have back gate terminals connected in common to a connection node of the two sub-transistors,
the output signal from the disconnection detection circuit is input to the gates of the two sub-transistors,
the output signal input to the two sub-transistors connected to the first output transistor is set to a voltage at the output terminal at a time of non-occurrence of the first disconnection and set to the second power supply voltage at a time of occurrence of the first disconnection, and
the output signal input to the two sub-transistors connected to the second output transistor is set to a voltage at the output terminal at a time of non-occurrence of the second disconnection and set to the first power supply voltage at a time of occurrence of the second disconnection.
4. The semiconductor device according to claim 1, wherein the output transistor control circuit is arranged corresponding to both of the first and second output transistors.
5. The semiconductor device according to claim 1, wherein
the disconnection detection circuit detects at least one of the first and second disconnections, based on comparison between a third reference voltage obtained by dividing a voltage difference between the first and second power supply terminals and a fourth reference voltage, and
the fourth reference voltage is generated such that a voltage variation smaller than a voltage variation produced in the third reference voltage is generated, relative to a common variation amount of the voltage difference between the first and second power supply terminals.

6. A semiconductor device comprising:
a first power supply terminal receiving a first power supply voltage;
a second power supply terminal receiving a second power supply voltage lower than the first power supply voltage;
a first output transistor connected between the first power supply terminal and an output node, the first output transistor allowing current in accordance with a first control voltage to flow from the first power supply terminal to the output node;
a second output transistor connected between the output node and the second power supply terminal, the second output transistor allowing current in accordance with a second control voltage to flow from the output node to the second power supply terminal;
an output terminal electrically connected to the output node, the output terminal being capable of electrical contact from outside of the semiconductor device; and
a switch circuit including at least one of a first switch transistor of a first conductivity type and a second switch transistor of a second conductivity type, wherein
the first switch transistor is inserted and connected in a first path from the first power supply terminal to the output terminal via a body diode of the first output transistor and the output node, and
the second switch transistor is inserted and connected in a second path from the second power supply terminal to the output terminal via a body diode of the second output transistor and the output node,
the semiconductor device further comprising
a disconnection detection circuit to generate at least one of a first reference voltage to control ON and OFF of the first switch transistor and a second reference voltage to control ON and OFF of the second switch transistor, wherein
the first reference voltage is generated to turn on the first switch transistor at a time of non-occurrence of first disconnection in an input path of the first power supply voltage to the first power supply terminal and to turn off the first switch transistor at a time of occurrence of the first disconnection, and
the second reference voltage is generated to turn on the second switch transistor at a time of non-occurrence of second disconnection in an input path of the second power supply voltage to the second power supply terminal and to turn off the second switch transistor at a time of occurrence of the second disconnection.

7. The semiconductor device according to claim 6, wherein
the switch circuit includes the first switch transistor or the second switch transistor, and
the first or second switch transistor is connected between the output terminal and the output node.

8. The semiconductor device according to claim 7, wherein
the disconnection detection circuit includes a series circuit of a resistor and a current source connected between the first power supply terminal and the second power supply terminal,
the current source operates and generates current at a time of supply of the first and second power supply voltages,
the first or second reference voltage is output from a predetermined node in the series circuit, and
when a voltage drop amount in the resistor by current of the current source disappears due to occurrence of the first or second disconnection, a voltage at the predetermined node changes from a voltage level at which the first or second transistor turns on to a voltage level at which the first or second switch transistor turns off.

9. The semiconductor device according to claim 8, wherein
the semiconductor device further comprises a bias circuit to operate with the first and second power supply voltages and generate bias current, and
the current source generates the current by a transistor forming a current mirror with a transistor generating the bias current.

10. The semiconductor device according to claim 7, wherein
the first or second switch transistor includes two transistors connected in series, and
the two transistors have back gate terminals connected in common to a connection node of the two transistors.

11. The semiconductor device according to claim 6, wherein
the switch circuit includes both of the first switch transistor and the second switch transistor, and
the first and second switch transistors are connected in series between the output node and the output terminal.

12. The semiconductor device according to claim 11, wherein
each of the first and second switch transistors includes two transistors connected in series, and
the two transistors have back gate terminals connected in common to a connection node of the two transistors.

13. The semiconductor device according to claim 11, wherein
the disconnection detection circuit includes a first series circuit of a first resistor and a first current source and a second series circuit of a second resistor and a second current source, the first series circuit and the second series circuit being connected between the first power supply terminal and the second power supply terminal,
the first and second current sources operate at a time of supply of the first and second power supply voltages and generate first current and second current, respectively,
the first reference voltage is output from a first node in the first series circuit,
when a voltage drop amount in the first resistor by the first current disappears due to occurrence of the first disconnection, a voltage at the first node changes from a voltage level at which the first switch transistor turns on to a voltage level at which the first switch transistor turns off,
the second reference voltage is output from a second node in the second series circuit, and
when a voltage drop amount in the second resistor by the second current disappears due to occurrence of the second disconnection, a voltage at the second node changes from a voltage level at which the second switch transistor turns on to a voltage level at which the second switch transistor turns off.

14. The semiconductor device according to claim 13,
the semiconductor device further comprises a bias circuit to operate with the first and second power supply voltages and generate bias current,
the first current source generates the first current by a first transistor forming a current mirror with a transistor generating the bias current, and
the second current source generates the second current by a second transistor forming a current mirror with the transistor generating the bias current.

15. The semiconductor device according to claim 14, wherein the first and second transistors have same conductivity type and characteristics.

16. The semiconductor device according to claim 11, wherein
the first reference voltage and the second reference voltage are input to the gate of the first switch transistor and the gate of the second switch transistor, respectively,
the disconnection detection circuit sets the first reference voltage to one of the first and second power supply voltages that corresponds to a gate voltage to turn on the first switch transistor at a time of non-occurrence of the first disconnection and sets the first reference voltage to a voltage equivalent to a voltage at the output terminal at a time of occurrence of the first disconnection, and
the disconnection detection circuit sets the second reference voltage to the other of the first and second power supply voltages that corresponds to a gate voltage to turn on the second switch transistor at a time of non-occurrence of the second disconnection and sets the second reference voltage to a voltage equivalent to a voltage at the output terminal at a time of occurrence of the second disconnection.

17. The semiconductor device according to claim 6, wherein
the switch circuit includes the first switch transistor, and
the first switch transistor is connected between a back gate terminal and a source terminal of the first output transistor.

18. The semiconductor device according to claim 6, wherein
the switch circuit includes the second switch transistor, and
the second switch transistor is connected between a back gate terminal and a source terminal of the second output transistor.

19. The semiconductor device according to claim 6, wherein
the switch circuit includes both of the first switch transistor and the second switch transistor,
the first switch transistor is connected between a back gate terminal and a source terminal of the first output transistor, and
the second switch transistor is connected between a back gate terminal and a source terminal of the second output transistor.

20. The semiconductor device according to claim 6, wherein
the disconnection detection circuit includes a series circuit of a resistor and a current source connected between the first power supply terminal and the second power supply terminal,
the current source operates and generates current at a time of supply of the first and second power supply voltages,
each of the first and second reference voltages is output from a predetermined node in the series circuit, and
when a voltage drop amount in the resistor by current of the current source disappears due to occurrence of the first or second disconnection, a voltage at the predetermined node changes from a voltage level at which the first or second switch transistor turns on to a voltage level at which the first or second switch transistor turns off.

* * * * *